(12) United States Patent
Huang

(10) Patent No.: US 12,362,290 B2
(45) Date of Patent: Jul. 15, 2025

(54) SEMICONDUCTOR STRUCTURE WITH A POROUS STRUCTURE

(71) Applicant: NANYA TECHNOLOGY CORPORATION, New Taipei (TW)

(72) Inventor: Tse-Yao Huang, Taipei (TW)

(73) Assignee: NANYA TECHNOLOGY CORPORATION, New Taipei (TW)

( * ) Notice: Subject to any disclaimer, the term of this patent is extended or adjusted under 35 U.S.C. 154(b) by 570 days.

(21) Appl. No.: 17/742,541

(22) Filed: May 12, 2022

(65) Prior Publication Data

US 2023/0369243 A1 Nov. 16, 2023

(51) Int. Cl.
*H01L 23/00* (2006.01)

(52) U.S. Cl.
CPC .......... *H01L 23/562* (2013.01); *H01L 23/564* (2013.01); *H01L 24/03* (2013.01);
(Continued)

(58) Field of Classification Search
CPC ..... H01L 23/562; H01L 23/564; H01L 24/03; H01L 24/05; H01L 2224/03614; H01L 2224/05025; H01L 2924/351; H01L 2224/03622; H01L 23/5226; H01L 23/528; H01L 21/76877; H01L 21/76831; H01L 24/29; H01L 23/522; H01L 23/5384; H01L 21/02063; H01L 21/02074; H01L 23/49827; H01L 23/585; H01L 24/13; H01L 21/76895; H01L 2224/03914; H01L 2924/18162; H01L 24/75; H01L 21/02203; H01L 21/31695; H01L 23/53238; H01L 23/53295; H01L 21/76835; H01L 21/76826; H01L 21/76864; H01L 21/76867
See application file for complete search history.

(56) References Cited

U.S. PATENT DOCUMENTS

2008/0054467 A1* 3/2008 Ohba ................ H01L 21/76826
438/653
2010/0006330 A1* 1/2010 Fu ........................... H01L 24/19
29/856
(Continued)

FOREIGN PATENT DOCUMENTS

| TW | I596701 B | 8/2017 |
|----|-----------|--------|
| TW | 202143418 A | 11/2021 |
| TW | 202209600 A | 3/2022 |

OTHER PUBLICATIONS

Office Action with the search report mailed on Nov. 6, 2023 related to Taiwanese Application No. 111125029.
(Continued)

*Primary Examiner* — Sonya McCall-Shepard
(74) *Attorney, Agent, or Firm* — Xuan Zhang

(57) ABSTRACT

The present application provides a semiconductor structure having a porous structure between a conductive pad and a metal layer. The semiconductor structure includes: a substrate including an interconnection structure; a dielectric layer disposed over the substrate; a conductive pad disposed over the dielectric layer; a passivation layer, disposed over the dielectric layer and partially exposing the conductive pad; and a porous layer, surrounded by the dielectric layer and extending between the substrate and the conductive pad.

19 Claims, 32 Drawing Sheets

(52) U.S. Cl.
CPC .... *H01L 24/05* (2013.01); *H01L 2224/03614* (2013.01); *H01L 2224/03622* (2013.01); *H01L 2224/05025* (2013.01); *H01L 2924/351* (2013.01)

(56) References Cited

U.S. PATENT DOCUMENTS

2017/0338214 A1\* 11/2017 Uzoh ................. H01L 25/0657
2020/0411379 A1   12/2020 Li et al.

OTHER PUBLICATIONS

Office Action with the search report mailed on Mar. 2, 2023 related to Taiwanese Application No. 111125026.

\* cited by examiner

SEMICONDUCTOR STRUCTURE WITH A POROUS STRUCTURE

TECHNICAL FIELD

The present disclosure relates to a semiconductor structure, and more particularly, to a semiconductor structure with a porous structure.

DISCUSSION OF THE BACKGROUND

Semiconductor devices are used in a variety of electronic applications, such as personal computers, cellular telephones, digital cameras, and other electronic equipment. Dimensions of the semiconductor devices are continuously being scaled down to meet the increasing demand of computing ability. However, a variety of issues arise during the down-scaling process, and such issues are continuously increasing in quantity and complexity. Therefore, challenges remain in achieving improved quality, yield, performance and reliability and reduced complexity.

This Discussion of the Background section is provided for background information only. The statements in this Discussion of the Background are not an admission that the subject matter disclosed in this Discussion of the Background section constitute prior art to the present disclosure, and no part of this Discussion of the Background section may be used as an admission that any part of this application, including this Discussion of the Background section, constitutes prior art to the present disclosure.

SUMMARY

One aspect of the present disclosure provides a semiconductor structure. The semiconductor structure includes: a substrate including an interconnection structure; a dielectric layer disposed over the substrate; a conductive pad disposed over the dielectric layer; a passivation layer, disposed over the dielectric layer and partially exposing the conductive pad; and a porous layer, surrounded by the dielectric layer and extending between the substrate and the conductive pad.

In some embodiments, the semiconductor structure further includes: a first liner, surrounding the porous layer and disposed within the dielectric layer.

In some embodiments, the first liner at least partially surrounds a sidewall and a bottom surface of the porous layer.

In some embodiments, the first liner surrounds a sidewall of the porous layer, and the porous layer contacts the substrate.

In some embodiments, the semiconductor structure further includes: a conductive via, disposed adjacent to the porous layer and electrically connecting the conductive pad and the interconnection structure.

In some embodiments, a portion of the dielectric layer is disposed between the conductive via and the porous layer.

In some embodiments, a top cross-sectional area of the conductive via is substantially greater than a top cross-sectional area of the porous layer.

In some embodiments, the conductive via extends through the dielectric layer.

In some embodiments, the conductive via includes a plurality of conductive vias, and the plurality of conductive vias are separated from one another.

In some embodiments, the plurality of conductive vias are covered by the conductive pad.

In some embodiments, a porosity of the porous layer is between 5% and 30%.

In some embodiments, a porosity of the porous layer is between 10% and 15%.

In some embodiments, the semiconductor structure further includes: a second liner, disposed between the porous layer and the conductive pad.

In some embodiments, the porous layer is encircled by the first liner and the second liner.

In some embodiments, the porous layer is disposed in a central region of the conductive pad from a top view perspective.

Another aspect of the present disclosure provides a semiconductor structure. The semiconductor structure includes: a substrate including an interconnection structure; a dielectric layer disposed over the substrate; a porous pillar, disposed over the substrate and extending through the dielectric layer; a first moisture-preventing layer, surrounding the porous pillar and disposed within the dielectric layer; a conductive via, extending within the dielectric layer and disposed adjacent to the porous pillar; and a conductive pad, disposed over the dielectric layer and covering the conductive via and the porous pillar.

In some embodiments, the semiconductor structure further includes: a second moisture-preventing layer, disposed between the porous pillar and the conductive pad.

In some embodiments, the conductive via penetrates the second moisture-preventing layer and contacts the conductive pad.

In some embodiments, the semiconductor structure further includes: a passivation layer, disposed over the dielectric layer and separated from the dielectric layer by the second moisture-preventing layer.

In some embodiments, the porous pillar includes one or more low-k materials.

In some embodiments, the conductive via includes tungsten, copper, cobalt, ruthenium, molybdenum, or a combination thereof.

In some embodiments, the conductive via includes: a barrier member and a conductive member surrounded by the conductive via.

In some embodiments, the barrier layer includes titanium, tantalum, titanium nitride, tantalum nitride, or a combination thereof.

In some embodiments, the first moisture-preventing layer includes nitride, high-k material, or a combination thereof.

Another aspect of the present disclosure provides a method of manufacturing a semiconductor structure. The method includes: forming a dielectric layer over a substrate; forming an opening in the dielectric layer; forming a first liner conformal to the opening; forming a porous layer in the opening and surrounded by the first liner; forming a conductive via penetrating the dielectric layer; and forming a conductive pad over the dielectric layer, wherein the conductive pad covers the porous layer and the conductive via.

In some embodiments, the method further includes: forming a second liner over the dielectric layer prior to the formation of the conductive via, wherein the conductive via penetrates the second liner.

In some embodiments, a top surface of the porous layer is substantially aligned with a top surface of the first liner.

In some embodiments, the formation of the first liner includes: depositing a first nitride layer conformal to the dielectric layer and the opening; and removing horizontal portions of the first nitride layer above the dielectric layer and in the opening.

In some embodiments, the formation of the conductive pad includes: depositing a conductive layer over dielectric layer; forming a photoresist layer over the conductive layer; removing a portion of the conductive layer exposed through the photoresist layer to form the conductive pad; and removing the photoresist layer.

In some embodiments, the method further includes: forming a passivation material over the dielectric layer and the conductive pad; and exposing at least a portion of the conductive pad.

In some embodiments, the formation of the porous layer includes: forming an energy-removable material over the dielectric layer and in the opening; performing an energy treatment on the energy-removable material; and removing a portion of the energy-removable material disposed above the dielectric layer.

In some embodiments, the energy-removable material includes thermally decomposable material, photonic decomposable material, e-beam decomposable material, or a combination thereof.

In some embodiments, the energy-removable material includes a base material and a decomposable porogen material.

In some embodiments, the base material includes a methylsilsesquioxane-based material, and the decomposable porogen material includes a porogen organic compound.

In some embodiments, the energy treatment includes applying a heat source or a light source to the energy-removable material.

The foregoing has outlined rather broadly the features and technical advantages of the present disclosure in order that the detailed description of the disclosure that follows may be better understood. Additional features and technical advantages of the disclosure are described hereinafter, and form the subject of the claims of the disclosure. It should be appreciated by those skilled in the art that the concepts and specific embodiments disclosed may be utilized as a basis for modifying or designing other structures, or processes, for carrying out the purposes of the present disclosure. It should also be realized by those skilled in the art that such equivalent constructions do not depart from the spirit or scope of the disclosure as set forth in the appended claims.

BRIEF DESCRIPTION OF THE DRAWINGS

A more complete understanding of the present disclosure may be derived by referring to the detailed description and claims. The disclosure should also be understood to be coupled to the figures' reference numbers, which refer to similar elements throughout the description.

DETAILED DESCRIPTION

Figure 1:
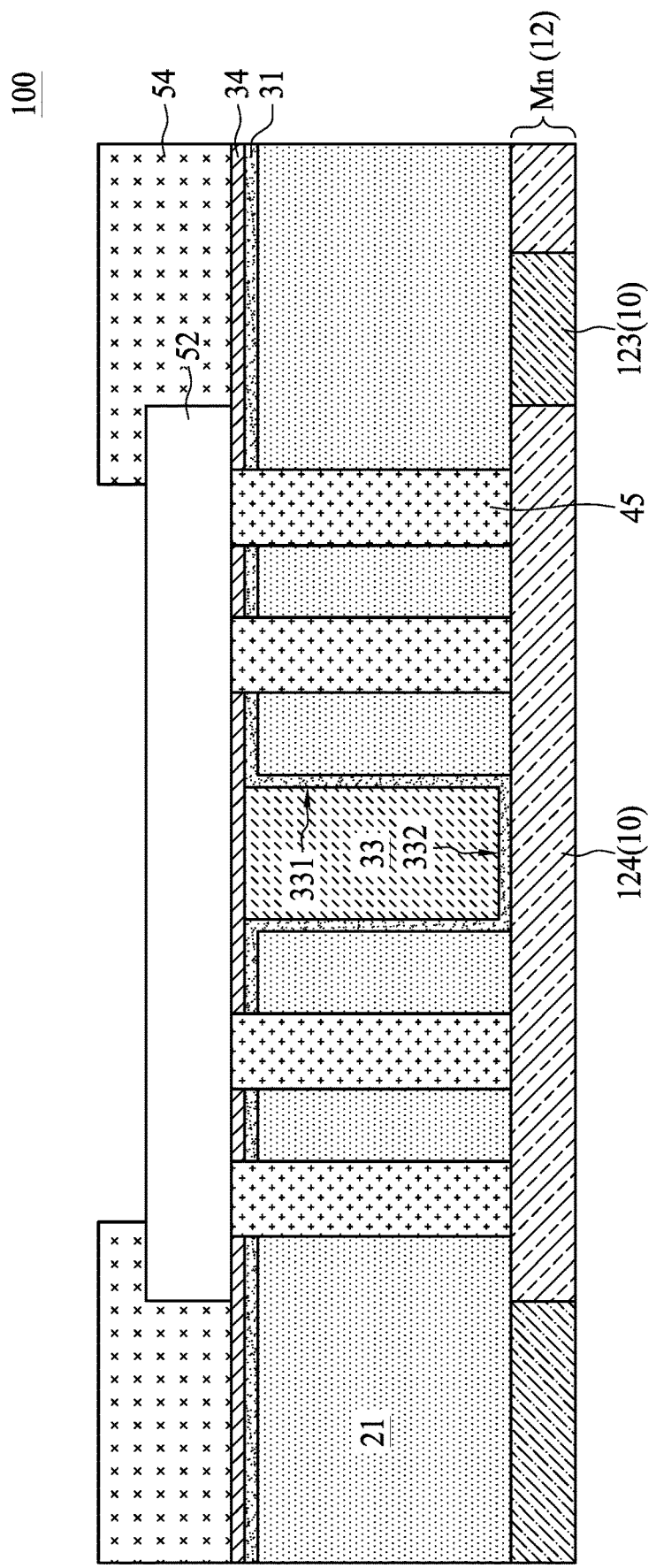
FIG. 1 is a schematic cross-sectional diagram of a semiconductor structure in accordance with some embodiments of the present disclosure.

Embodiments, or examples, of the disclosure illustrated in the drawings are now described using specific language. It shall be understood that no limitation of the scope of the disclosure is hereby intended. Any alteration or modification of the described embodiments, and any further applications of principles described in this document, are to be considered as normally occurring to one of ordinary skill in the art to which the disclosure relates. Reference numerals may be repeated throughout the embodiments, but this does not necessarily mean that feature(s) of one embodiment apply to another embodiment, even if they share the same reference numeral.

It shall be understood that, although the terms first, second, third, etc. may be used herein to describe various elements, components, regions, layers or sections, these elements, components, regions, layers or sections are not limited by these terms. Rather, these terms are merely used to distinguish one element, component, region, layer or section from another element, component, region, layer or section. Thus, a first element, component, region, layer or section discussed below could be termed a second element, component, region, layer or section without departing from the teachings of the present inventive concept.

The terminology used herein is for the purpose of describing particular example embodiments only and is not intended to be limiting to the present inventive concept. As used herein, the singular forms "a," "an" and "the" are intended to include the plural forms as well, unless the context clearly indicates otherwise. It shall be understood that the terms "comprises" and "comprising," when used in this specification, point out the presence of stated features, integers, steps, operations, elements, or components, but do not preclude the presence or addition of one or more other features, integers, steps, operations, elements, components, or groups thereof.

FIG. 1 is schematic cross-sectional diagram of a semiconductor structure 100 in accordance with some embodiments of the present disclosure. The semiconductor structure 100 may include a substrate 10, a dielectric layer 21, a conductive pad 52, a passivation layer 54 and a porous layer 33. In some embodiments, the substrate 10 includes an interconnection structure 12. For ease of illustration and simplicity of drawings, only a topmost metal layer Mn is depicted in FIG. 1. In some embodiments, the metal layer Mn includes multiple metal lines 124 and an intermetal dielectric (IMD) layer 123 surrounding the metal lines 124. The metal lines 124 may be separated and electrically isolated from each other by the IMD layer 123. In some embodiments, the dielectric layer 21 is disposed over the substrate 10. In some embodiments, the conductive pad 52 is disposed over the dielectric layer 21. In some embodiments, the passivation layer 54 is disposed over the dielectric layer 21. In some embodiments, the passivation layer 54 covers the conductive pad 52. In some embodiments, the conductive pad 52 is at least partially exposed through the passivation layer 54. In some embodiments, the porous layer 33 extends between the conductive pad 52 and the substrate 10. In some embodiments, the porous layer 33 is sandwiched between the conductive pad 52 and the substrate 10. In some embodiments, the porous layer 33 is surrounded by the dielectric layer 21. In some embodiments, a porosity of the porous layer 33 is between 5% and 30%. In some embodiments, the porosity of the porous layer 33 is between 10% and 15%. In some embodiments, the porous layer 33 includes low-k material. In some embodiments, the porous layer 33 has a pillar configuration. In some embodiments, the porous layer 33 may be referred to as a porous pillar 33.

The porous layer 33 may be formed from an energy-removable material, as described below. In some embodiments, the energy-removable material may include a material such as a thermally decomposable material, a photonic decomposable material, an e-beam decomposable material, or a combination thereof. For example, the energy-removable material may include a base material and a decomposable porogen material that is sacrificially removed upon being exposed to an energy source.

The porous layer 33 may include a skeleton and a plurality of empty spaces disposed among the skeleton. The plurality of empty spaces may connect to each other and may be filled with air. The skeleton may include, for example, silicon oxide or methylsilsesquioxane. The porous layer 33 may serve as a force absorber during the manufacturing process of the semiconductor structure 100 or in application of the semiconductor structure 100. In some embodiments, due to a property of a porous structure, the porous layer 33 can absorb bonding forces on the semiconductor structure 100 or the conductive pad 52 during the manufacturing process. Thus, defect or damage of the semiconductor structure 100 can be reduced, and a performance and a production yield of the semiconductor structure 100 or an application thereof can be improved.

The semiconductor structure 100 may further include a first liner 31 surrounding the porous layer 33. In some embodiments, the first liner 31 extends through the dielectric layer 21. In some embodiments, at least a portion of the first liner 31 is disposed within the dielectric layer 21. In some embodiments, the first liner 31 is also disposed over the dielectric layer 21. In some embodiments, the first liner 31 surrounds only a sidewall 331 of the porous layer 33 (not shown in FIG. 1). In some embodiments, the first liner 31 surrounds the sidewall 331 and a bottom surface 332 of the porous layer 33. In some embodiments, the first liner 31 includes nitride, high-k material or a combination thereof. In some embodiments, the first liner 31 includes silicon nitride.

The semiconductor structure 100 may further include a second liner 34 disposed between the porous layer 33 and the conductive pad 52. In some embodiments, the second liner 34 is further disposed between the dielectric layer 21 and the conductive pad 52. In some embodiments, the second liner 34 is further disposed between the dielectric layer 21 and the passivation layer 54. In some embodiments, the porous layer 33 is encircled by the first liner 31 and the second liner 34. In some embodiments, the second liner 34 is a planar layer. In some embodiments, the second liner 34 includes nitride. In some embodiments, the second liner 34 includes a material same as that of the first liner 31. The first liner 31 and the second liner 34 are configured to prevent moisture from entering the porous layer 33. In some embodiments, the first liner 31 and the second liner 34 are referred to as a first moisture-preventing layer 31 and a second moisture-preventing layer 34.

The semiconductor structure 100 may further include at least one conductive via 45. The conductive via 45 may electrically connect the conductive pad 52 to the interconnection structure 12. More specifically, the conductive via 45 may electrically connect the conductive pad 52 to the metal line 124 in the topmost metal layer Mn of the interconnection structure 12. In some embodiments, the conductive via 45 is disposed in the dielectric layer 21 over the substrate 10. In some embodiments, the conductive via 45 is adjacent to the porous layer 33. In some embodiments, a portion of the dielectric layer 21 is disposed between the conductive via 45 and the porous layer 33. In some embodiments, the conductive via 45 is physically separated from the porous layer 33 by the dielectric layer 21. In some embodiments, the conductive via 45 extends through the dielectric layer 21. In some embodiments, the conductive via 45 extends through the first liner 31. In some embodiments, the conductive via 45 extends through the second liner 34. In some embodiments, the conductive via 45 includes tungsten, copper, cobalt, ruthenium, molybdenum, or a combination thereof.

Figure 2:
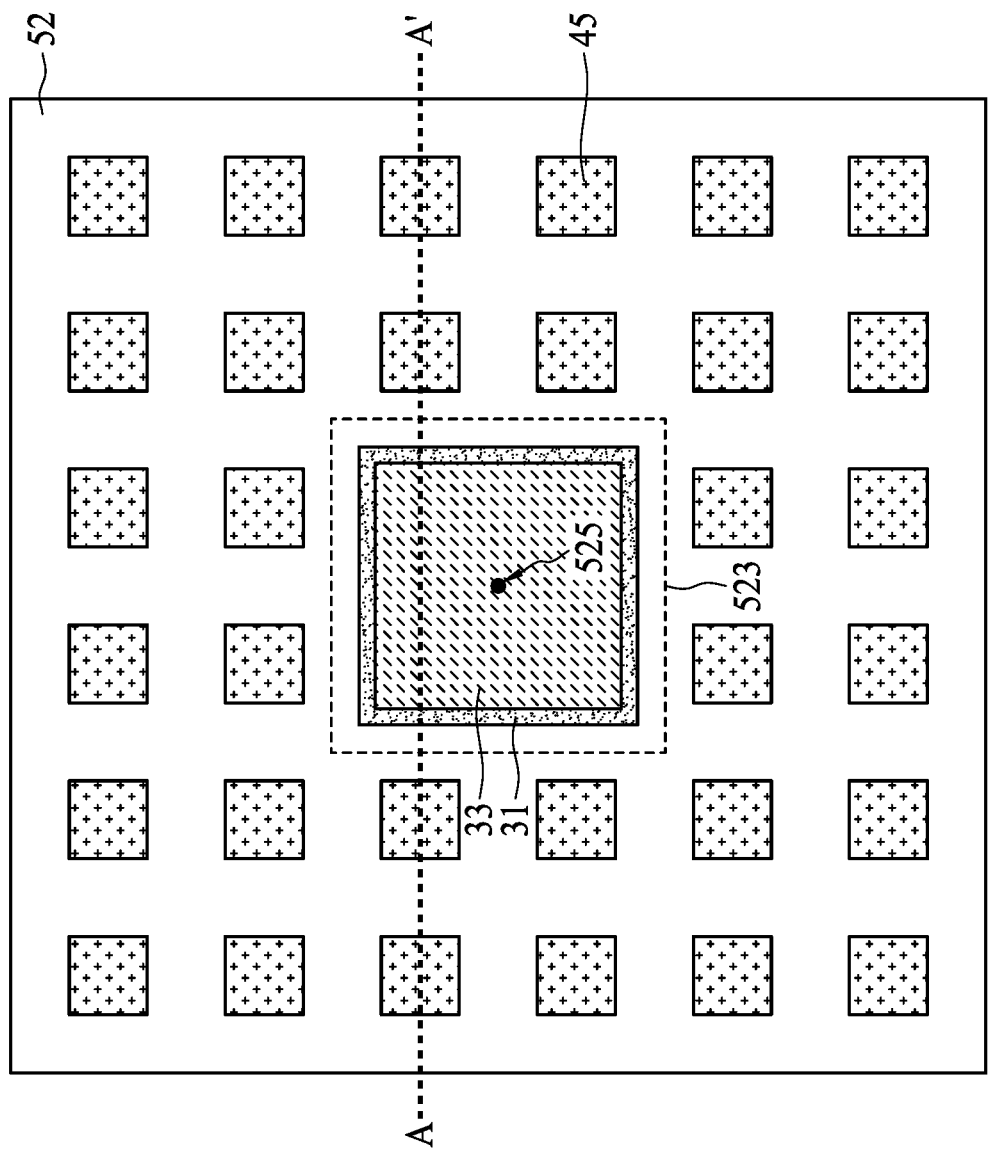
FIG. 2 is a schematic top-view perspective of a semiconductor structure in accordance with some embodiments of the present disclosure.

FIG. 2 is a schematic top-view perspective of the conductive pad 52, the conductive vias 45 and the porous layer 33 in accordance with some embodiments of the present disclosure. In some embodiments, FIG. 1 is a cross-sectional view along a line A-A' in FIG. 2. In some embodiments, the semiconductor structure 100 includes multiple conductive vias 45 as shown in FIGS. 1 and 2. In some embodiments, the conductive vias 45 are separated from one another. In some embodiments, the conductive vias 45 are all covered by the conductive pad 52. In some embodiments, the porous layer 33 is disposed in a central region 523 of the conductive pad 52. In some embodiments, the porous layer 33 overlaps a center 525 (indicated by a dot) of the conductive pad 52. In some embodiments, the conductive vias 45 surround the porous layer 33 as shown in FIG. 2. However, arrangement of the conductive vias 45 is not limited herein as long as the conductive pad 52 can be electrically connected to the interconnection structure 12 of the substrate 10. In some embodiments, a top cross-sectional area (an area seen from the top-view perspective as shown in FIG. 2) of the conductive vias 45 is substantially greater than a top cross-sectional area (an area seen from the top-view perspective as shown in FIG. 2) of the porous layer 33 for a purpose of lower electrical resistance and better electrical conductivity. In some embodiments, the top cross-sectional area of the conductive vias 45 is a total area of top surfaces of the conductive vias 45. In some embodiments, the top cross-sectional area of the porous layer 33 is an area of a top surface of the porous layer 33.

Figure 3:
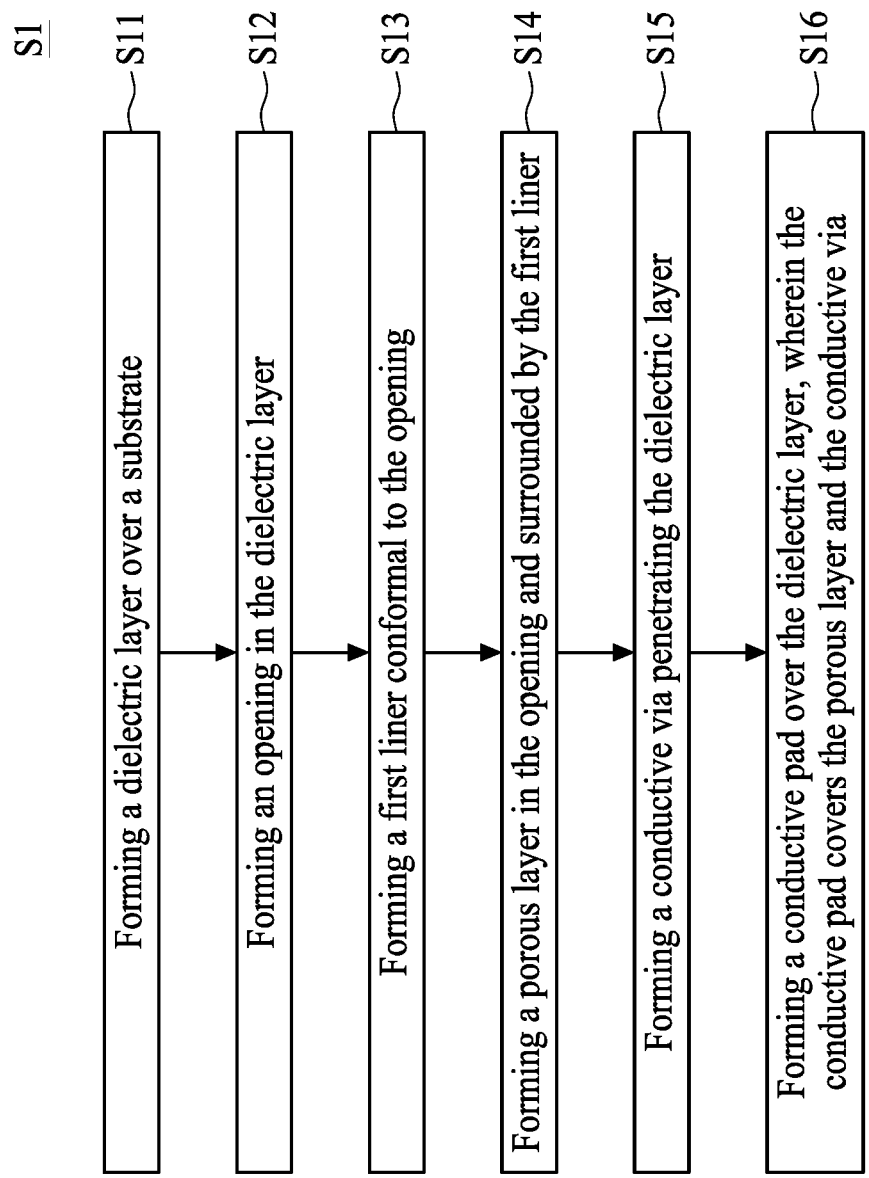
FIG. 3 is a flow diagram illustrating a method of manufacturing a semiconductor structure in accordance with some embodiments of the present disclosure.

FIG. 3 is a flow diagram illustrating a method S1 for manufacturing a semiconductor structure similar to the semiconductor structure 100 in accordance with some embodiments of the present disclosure. The method S1 includes a number of operations (S11, S12, S13, S14, S15 and S16) and the description and illustration are not deemed as a limitation to the sequence of the operations. In the operation S11, a dielectric layer is formed over a substrate. In the operation S12, an opening is formed in the dielectric layer. In the operation S13, a first liner is formed conformal to the opening. In the operation S14, a porous layer is formed in the opening and surrounded by the first liner. In the operation S15, a conductive via is formed penetrating the dielectric layer. In the operation S16, a conductive pad is formed over the dielectric layer, wherein the conductive pad covers the porous layer and the conductive via. It should be noted that the operations of the method S1 may be rearranged or otherwise modified within the scope of the various aspects. Additional processes may be provided before, during, and after the method S1, and some other processes may be only briefly described herein. Thus, other implementations are possible within the scope of the various aspects described herein.

FIGS. 4 to 26 are schematic diagrams illustrating various fabrication stages constructed according to the method S1 for manufacturing a semiconductor structure 200 in accordance with some embodiments of the present disclosure. The stages shown in FIGS. 4 to 26 are also illustrated schematically in the process flow in FIG. 3. In the subsequent discussion, the fabrication stages shown in FIGS. 4 to 26 are discussed in reference to the process operations in FIG. 3.

Figure 4:
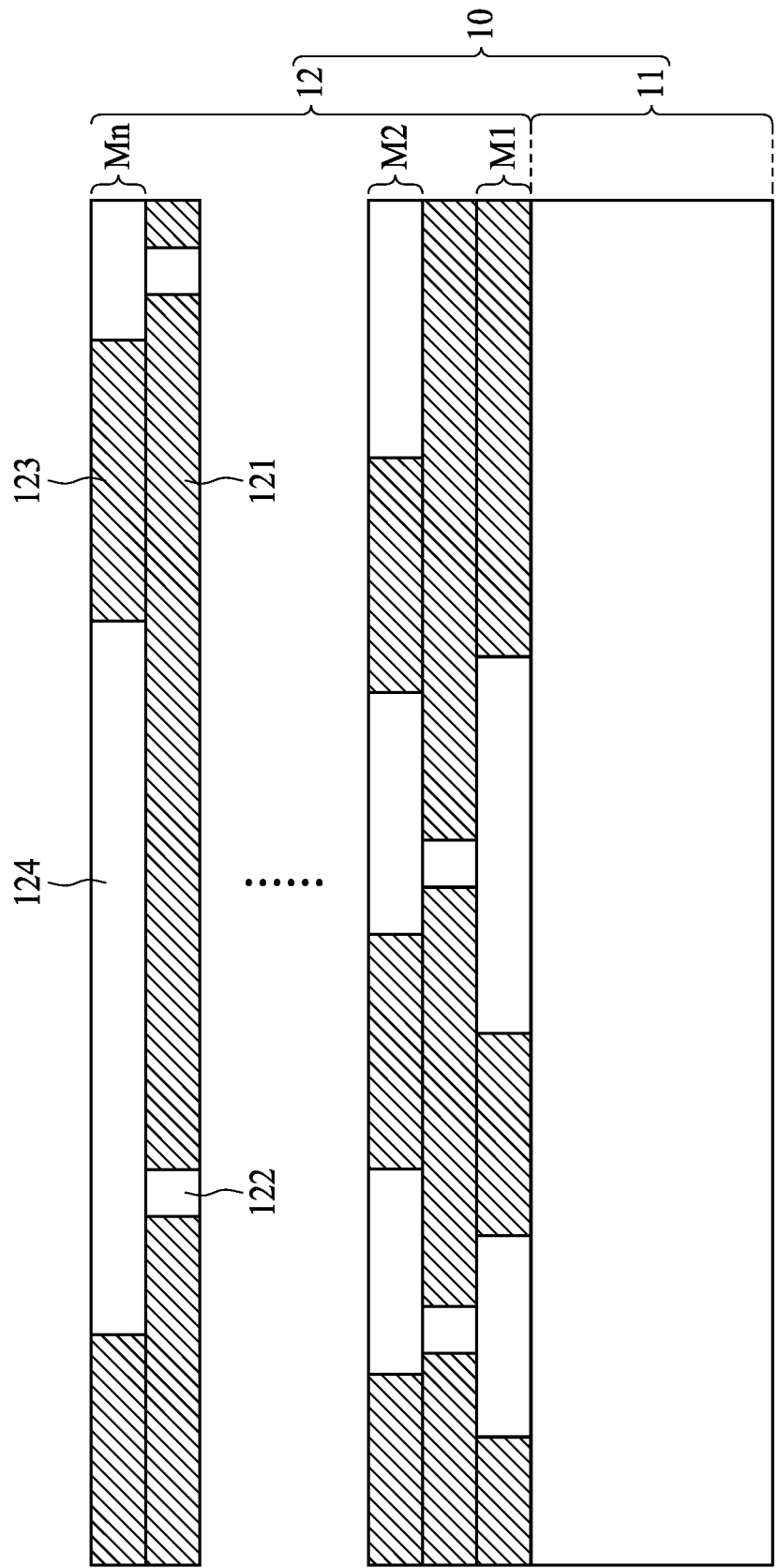
FIGS. 4 to 26 are cross-sectional diagrams of intermediate stages in the formation of a semiconductor structure in accordance with some embodiments of the present disclosure.

Referring to FIG. 4, FIG. 4 is a schematic cross-sectional diagram at a stage of the method S1 in accordance with some embodiments of the present disclosure. Prior to the operation S11, a substrate 10 is provided, received, or formed.

The substrate 10 may include an interconnection structure 12 disposed or formed over a substrate layer 11. The substrate layer 11 may be a semiconductor substrate, such as a bulk semiconductor, a semiconductor-on-insulator (SOI) substrate, or the like. The substrate layer 11 may be of a first conductivity type, e.g., a P-type substrate (acceptor type), or a second conductivity type, e.g., an N-type semiconductive substrate (donor type). Alternatively, the substrate layer 11 can include an elementary semiconductor including silicon or germanium in a single crystal form, a polycrystalline form, or an amorphous form; a compound semiconductor material including at least one of silicon carbide, gallium arsenide, gallium phosphide, indium phosphide, indium arsenide, and indium antimonide; an alloy semiconductor material including at least one of SiGe, GaAsP, AlInAs, AlGaAs, GaInAs, GaInP, and GaInAsP; any other suitable materials; or a combination thereof. In some embodiments, the alloy semiconductor substrate may be a SiGe alloy with a gradient Si:Ge feature in which Si and Ge compositions change from one ratio at one location to another ratio at another location of the gradient SiGe feature. In another embodiment, the SiGe alloy is formed over a silicon substrate. In some embodiments, a SiGe alloy can be mechanically strained by another material in contact with the SiGe alloy.

In some embodiments, the substrate layer 11 may be a multilayer structure, or the substrate layer 11 may include a multilayer compound semiconductor structure. In some embodiments, the substrate layer 11 includes semiconductor devices, electrical components, electrical elements or a combination thereof. In some embodiments, the substrate layer 11 includes transistors or functional units of transistors. The semiconductor devices, electrical components, or electrical elements may be formed in the substrate layer 11 following conventional methods of manufacturing semiconductors. The semiconductor devices, electrical components, or electrical elements can be active components or devices, and may include different types or generations of devices. The semiconductor devices, electrical components, or electrical elements can include a planar transistor, a multi-gate transistor, a gate-all-around field-effect transistor (GAAFET), a fin field-effect transistor (FinFET), a vertical transistor, a nanosheet transistor, a nanowire transistor, a passive device, a capacitor, a memory device or a combination thereof.

The interconnection structure 12 may include multiple metal layers M1 to Mn, wherein n is a positive integer greater than 1. The interconnection structure 12 may further include multiple via layers arranged alternately between the metal layers for electrical connection between the metal layers. In some embodiments, each metal layer is formed of metal lines and an intermetal dielectric (IMD) layer surrounding the metal lines. In some embodiments, each via layer is formed of metal vias and an IMD layer surrounding the metal vias. In some embodiments, the metal layer M1 of the interconnection structure 12 is a first metal layer above the substrate layer 11. In some embodiments, the metal layer Mn represents a topmost metal layer of the interconnection structure 12. In some embodiments, the metal layer Mn includes an IMD layer 123 and multiple metal lines 124 surrounded by the IMD layer 123. In some embodiments, a topmost via layer includes an IMD layer 121 and multiple vias 122 electrically connecting the metal lines 124 to a metal layer below. For a purpose of simplicity, only the metal layer Mn of the substrate 10 is described and illustrated in following description and related figures, but such depiction is not intended to limit the present disclosure. In some embodiments, the metal lines 124 include one or more metals, such as tungsten, copper, cobalt, ruthenium, molybdenum, titanium, tantalum, nickel, platinum, erbium, a combination thereof, an alloy thereof, or a combination of alloys thereof. In some embodiments, the metal lines 124 include tungsten, copper, platinum, or a combination thereof.

Figure 5:
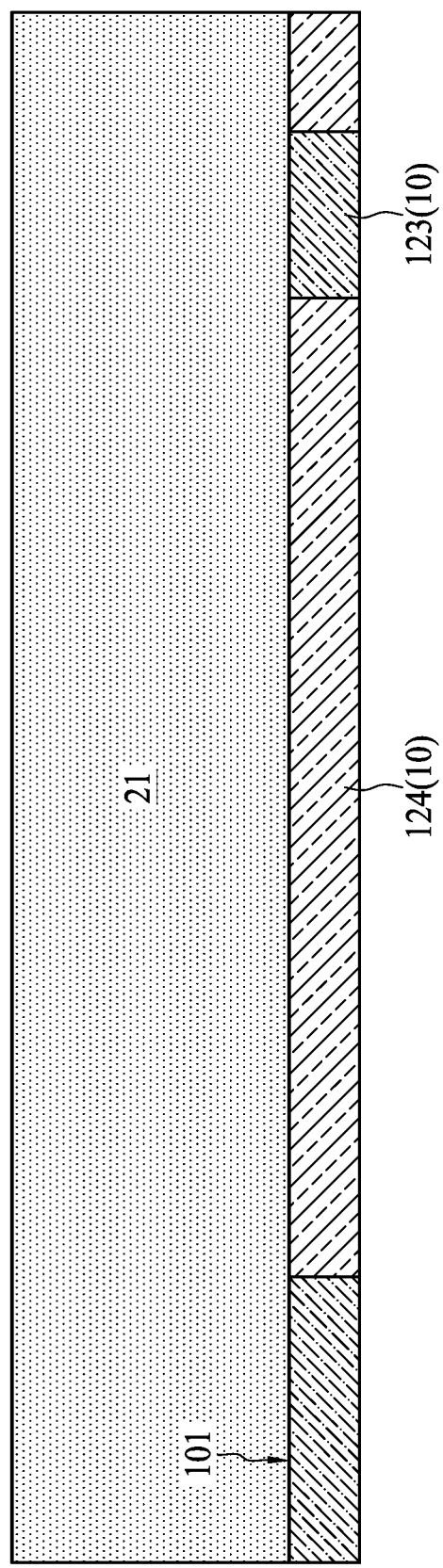

Referring to FIG. 5, FIG. 5 is a schematic cross-sectional diagram at a stage of the method S1 in accordance with some embodiments of the present disclosure. After the substrate 10 is provided, received or formed, in the operation S11, a dielectric layer 21 is formed over the substrate 10. In some embodiments, the dielectric layer 21 is formed over a top surface 101 of the substrate 10. In some embodiments, the dielectric layer 21 is an interlayer dielectric (ILD) layer. In some embodiments, the dielectric layer 21 includes one or more dielectric materials. In some embodiments, the dielectric material includes silicon oxide ($SiO_x$), silicon nitride ($Si_xN_y$), silicon oxynitride (SiON), or a combination thereof. In some embodiments, the dielectric layer 21 includes silicon dioxide ($SiO_2$).

In some embodiments, the dielectric material includes a polymeric material, an organic material, an inorganic material, a photoresist material or a combination thereof. In some embodiments, the dielectric material includes one or more low-k dielectric materials having a dielectric constant (k value) less than 3.9. In some embodiments, the low-k dielectric material includes fluorine-doped silicon dioxide, organosilicate glass (OSG), carbon-doped oxide (CDO), porous silicon dioxide, spin-on organic polymeric dielectrics, spin-on silicon-based polymeric dielectrics, or a combination thereof. In some embodiments, the dielectric material includes one or more high-k dielectric materials having a dielectric constant (k value) greater than 3.9. The high-k dielectric material may include hafnium oxide ($HfO_2$), zirconium oxide ($ZrO_2$), lanthanum oxide ($La_2O_3$), yttrium oxide ($Y_2O_3$), aluminum oxide ($Al_2O_3$), titanium oxide ($TiO_2$) or another applicable material. Other suitable materials are within the contemplated scope of this disclosure.

In some embodiments, the dielectric layer 21 is formed by a blanket deposition. In some embodiments, the dielectric layer 21 is formed by a chemical vapor deposition (CVD), a physical vapor deposition (PVD), an atomic layer deposition (ALD), a low-pressure chemical vapor deposition (LPCVD), a plasma-enhanced CVD (PECVD), or a combination thereof.

Figure 6:
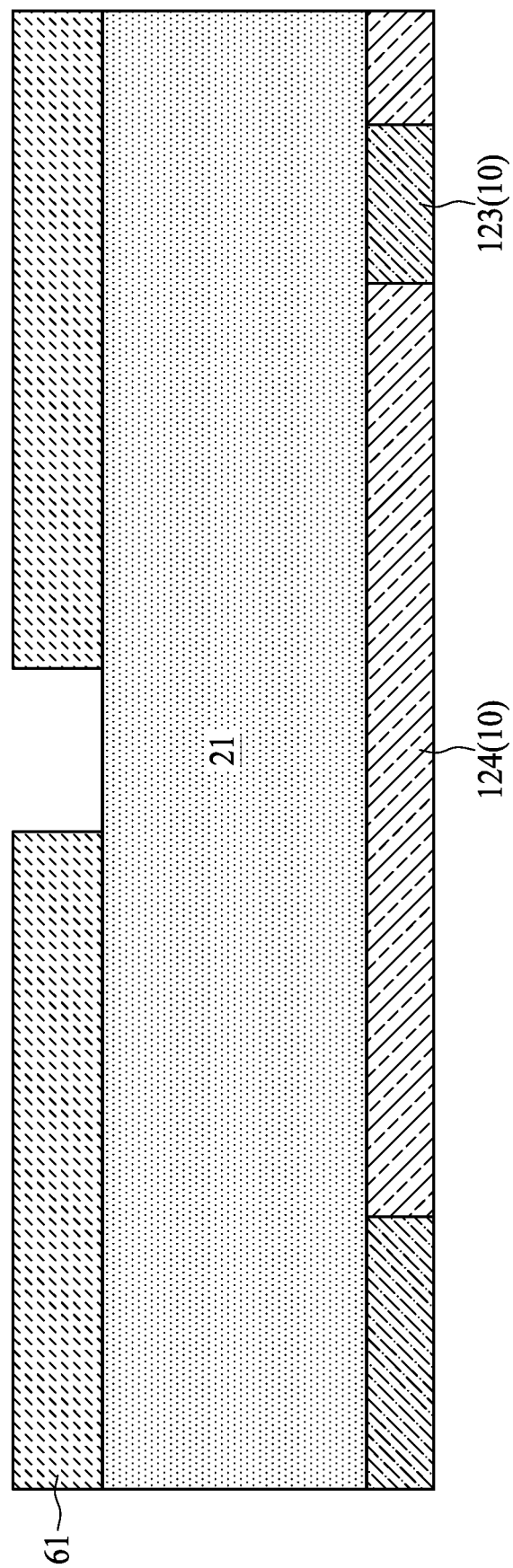

Referring to FIG. 6, FIG. 6 is a schematic cross-sectional diagram at a stage of the method S1 in accordance with some embodiments of the present disclosure. Prior to the operation S12, a photoresist layer 61 is formed over the dielectric layer 21. In some embodiments, a portion of the dielectric layer 21 is defined by and exposed through the photoresist layer 61. The photoresist layer 61 is configured to protect portions of the dielectric layer 21 covered by the photoresist layer 61 during a patterning operation that is subsequently performed.

Figure 7:
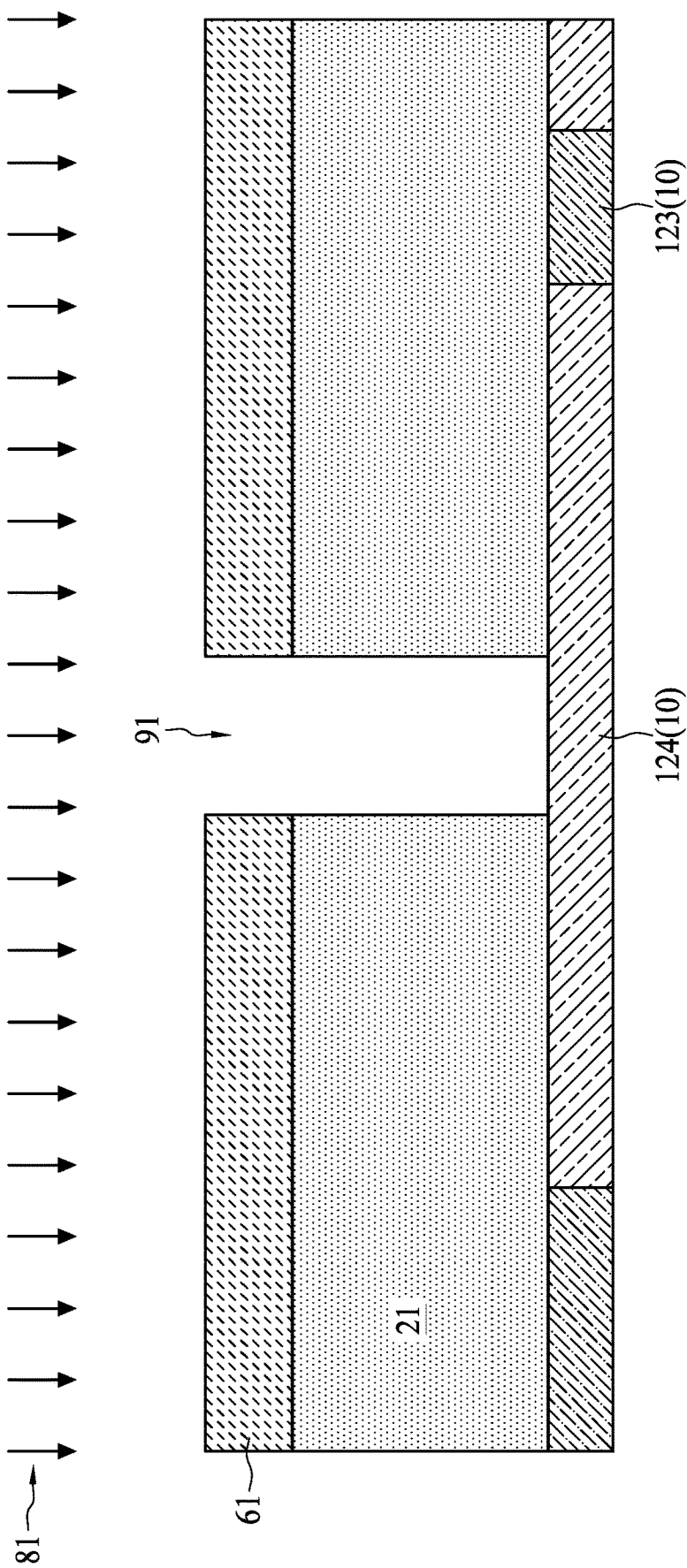

Referring to FIG. 7, FIG. 7 is a schematic cross-sectional diagram at a stage of the method S1 in accordance with some embodiments of the present disclosure. In the operation S12, the dielectric layer 21 is patterned to expose a portion of the substrate 10 and form an opening 91. In some embodiments, the portion of the substrate 10 is exposed through the dielectric layer 21 in the opening 91. In some embodiments, the opening 91 is defined by the dielectric layer 21 and the substrate 10. In some embodiments, the patterning of the dielectric layer 21 includes ion beam etching, directional dry etching, reactive ion etching, or a combination thereof. In some embodiments, the patterning of the dielectric layer 21 includes a dry etching operation 81, and the dry etching operation 81 stops at an exposure of the substrate 10. In some embodiments, the opening 91 exposes a portion of the metal line 124 in the substrate 10. In some embodiments, after the operation S11 and prior to the operation S12, a pre-cleaning operation, photoresist application (formation of the photoresist layer 21), exposure, developing and etching are sequentially performed to form the opening 91.

Figure 8:
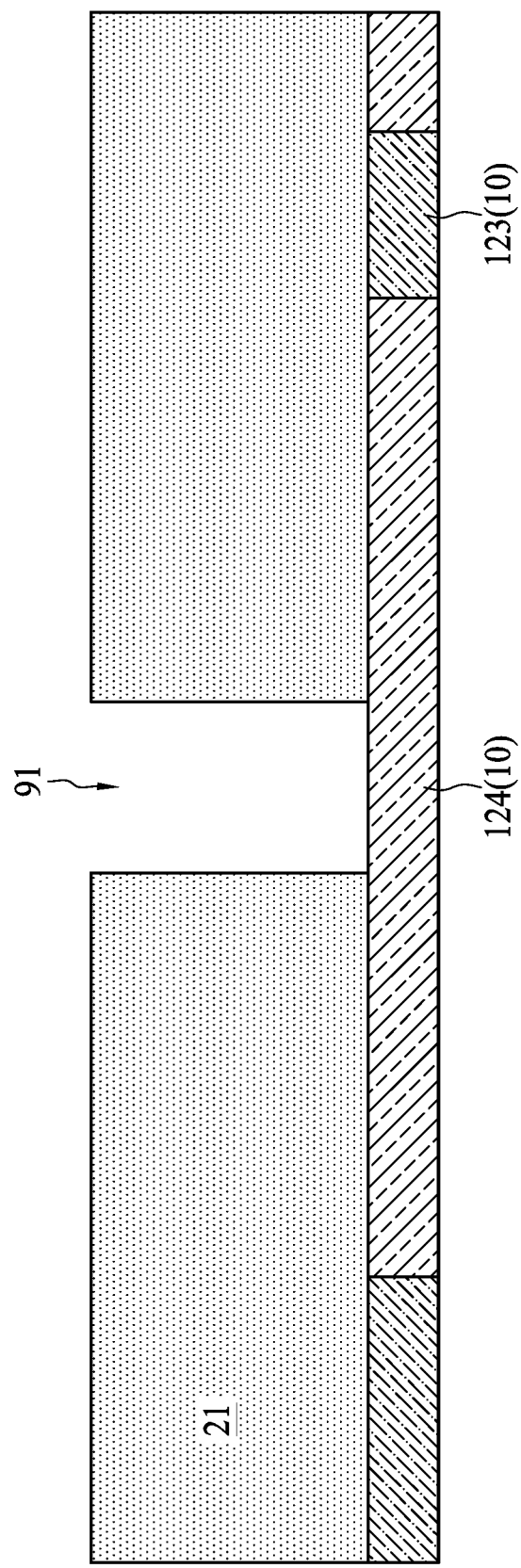

Referring to FIG. 8, FIG. 8 is a schematic cross-sectional diagram at a stage of the method S1 in accordance with some embodiments of the present disclosure. After the operation S12, the photoresist layer 61 is removed. In some embodiments, a wet etching operation is performed to remove the photoresist layer 61. In some embodiments, a post-cleaning operation is optionally performed after the removal of the photoresist layer 61.

Figure 9:
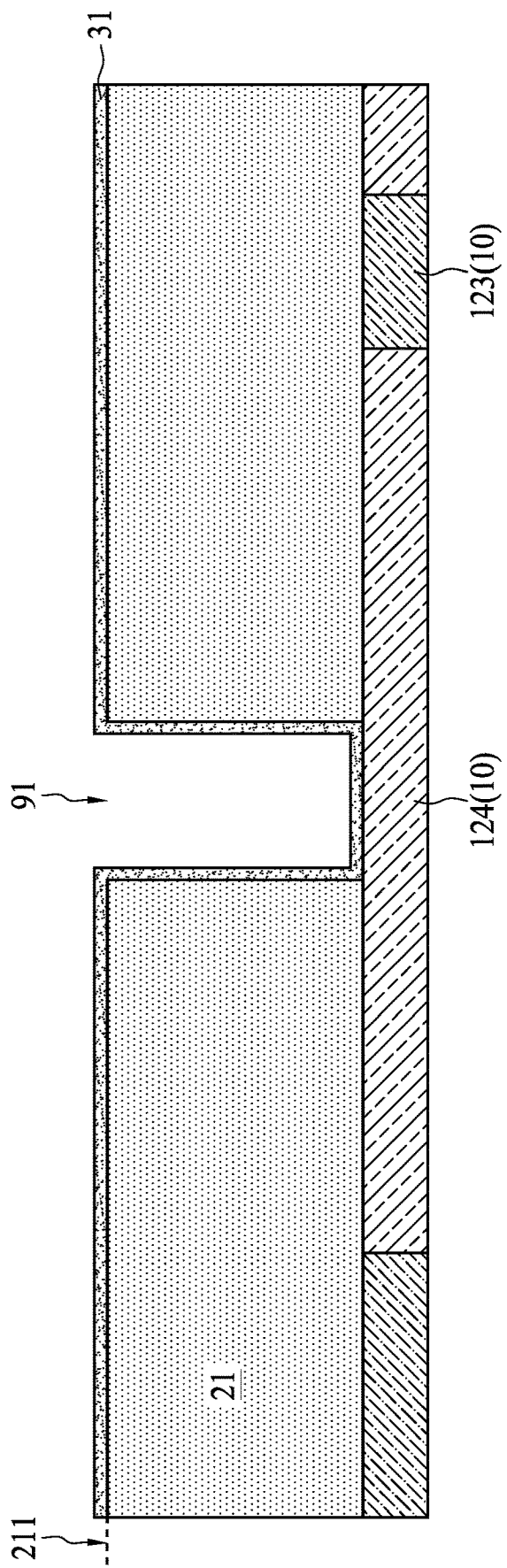

Referring to FIG. 9, FIG. 9 is a schematic cross-sectional diagram at a stage of the method S1 in accordance with some embodiments of the present disclosure. In the operation S13, a first liner 31 is formed over the dielectric layer 21. In some embodiments, the first liner 31 lines the opening 91 and a top surface 211 of the dielectric layer 21. In some embodiments, a profile of the first liner 31 is conformal to a profile of the dielectric layer 21 and the substrate 10. In some embodiments, a deposition is performed to form the first liner 31. In some embodiments, the first liner 31 is formed by a chemical vapor deposition (CVD), a physical vapor deposition (PVD), an atomic layer deposition (ALD), a low-pressure chemical vapor deposition (LPCVD), a plasma-enhanced CVD (PECVD), or a combination thereof. In some embodiments, the first liner 31 includes one or more dielectric materials. In some embodiments, the first liner 31 includes nitride, oxide, high-k material, or a combination thereof. In some embodiments, the first liner 31 includes silicon nitride. In some embodiments, a thickness of the first liner 31 is in a range of 1 to 50 nm for a purpose of moisture prevention. In some embodiments, the thickness of the first liner 31 is substantially consistent throughout the entire first liner 31.

Figure 10:
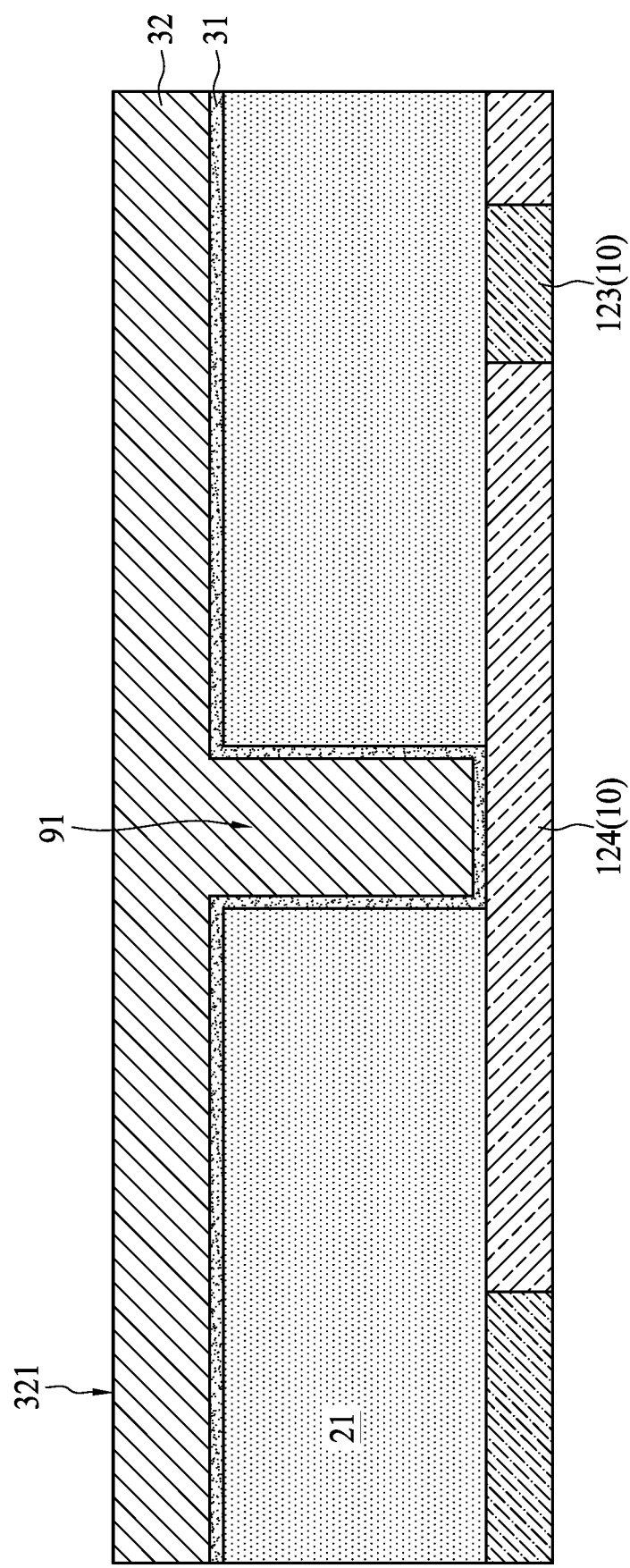

Referring to FIG. 10, FIG. 10 is a schematic cross-sectional diagram at a stage of the method S1 in accordance with some embodiments of the present disclosure. Prior to the operation S14, an energy-removable material 32 is formed over the dielectric layer 21 and in the opening 91. More specifically, the energy-removable material 32 is formed over the first liner 31 and in the opening 91. In some embodiments, the energy-removable material 32 is formed by a blanket deposition. In some embodiments, the energy-removable material 32 at least fills the opening 91. In some embodiments, a top surface 321 of the energy-removable material 32 is above the first liner 31. In some embodiments, the top surface 321 of the energy-removable material 32 is substantially planar. The energy-removable material 32 may include a material such as a thermally decomposable material, a photonic decomposable material, an e-beam decomposable material, or a combination thereof. For example, the energy-removable material 32 may include a base material and a decomposable porogen material that is sacrificially removed upon exposure to an energy source. The base material may include a methylsilsesquioxane-based material. The decomposable porogen material may include a porogen organic compound that provides porosity to the base material of the energy-removable material 32 after the exposure to the energy source. Alternatively, in another embodiment, the base material may be silicon oxide. The decomposable porogen material may include compounds including unsaturated bonds such as double bonds or triple bonds.

Figure 11:
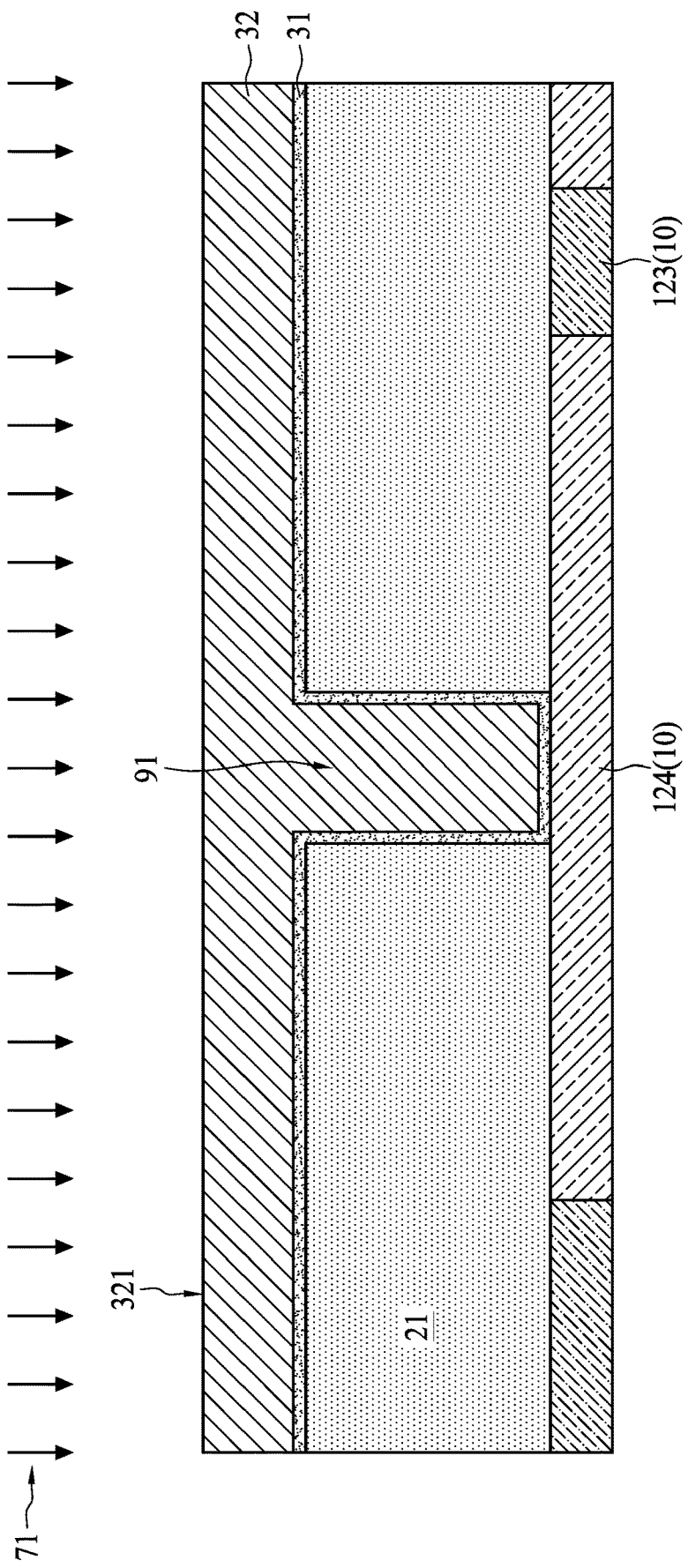
Figure 12:
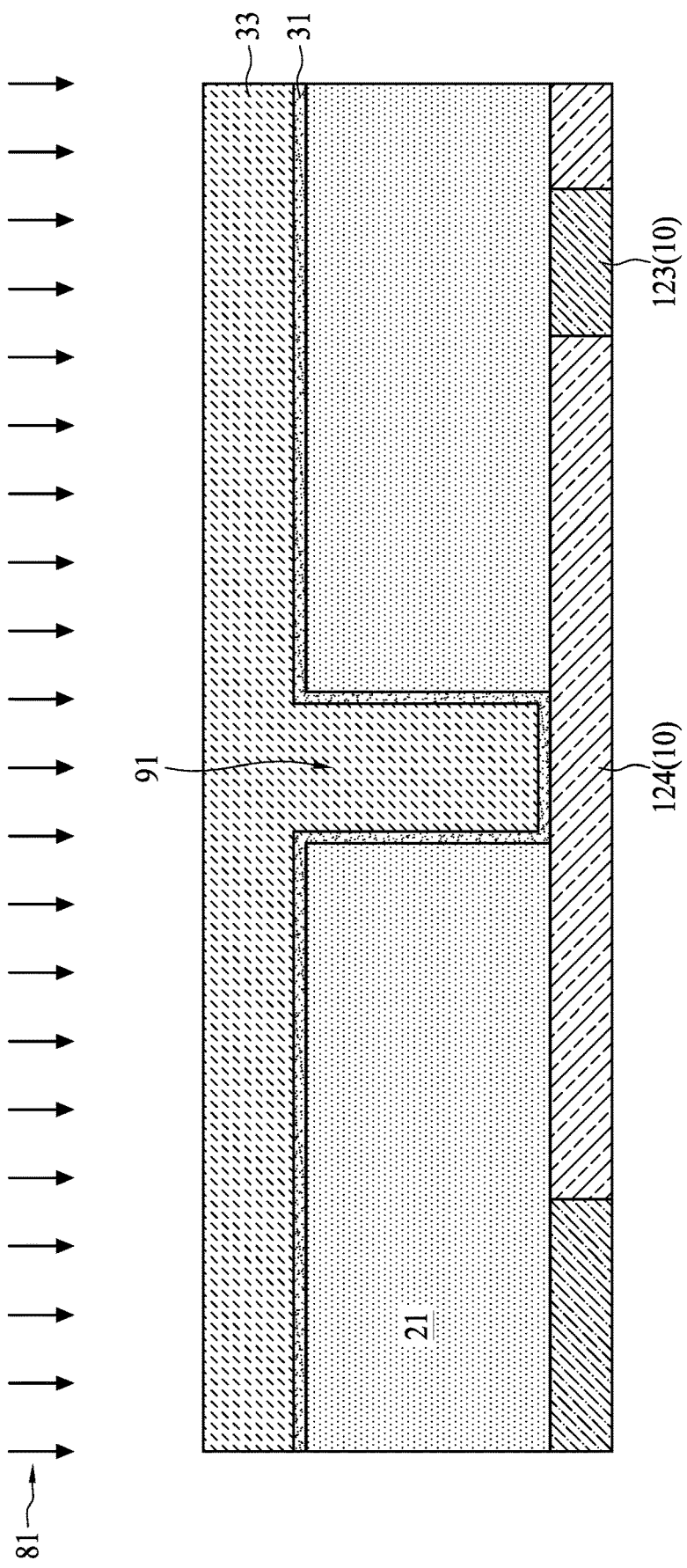

Referring to FIGS. 11 and 12, FIGS. 11 and 12 are schematic cross-sectional diagrams at different stages of the method S1 in accordance with some embodiments of the present disclosure. In the operation S14, an energy treatment 71 is performed on the energy-removable material 32 as shown in FIG. 11 to form a porous layer 33 as shown in FIG. 12. The energy treatment 71 may be performed by applying the energy source to the intermediate semiconductor structure as shown in FIG. 11. The energy source may include heat, light, or a combination thereof. When heat is used as the energy source, a temperature of the energy treatment 71 may be between about 800° C. and about 1000° C. When light is used as the energy source, an ultraviolet light may be applied. The energy treatment 71 may remove the decomposable porogen material from the energy-removable material 32 to generate empty spaces or pores, with the base material remaining in place. In alternative embodiments as described above, the base material may be silicon oxide, and the decomposable porogen material may include compounds having unsaturated bonds such as double bonds or triple bonds. In such embodiments, during the energy treatment 71, the unsaturated bonds of the decomposable porogen material may cross-link with silicon oxide of the base material. As a result, the decomposable porogen material may shrink and generate empty spaces or pores, with the base material remaining in place. The empty spaces or pores may be filled with air so that the porous layer 33 can provide support to a conductive pad to be formed above the porous layer 33 and also function as a cushion or a buffer to absorb forces on the semiconductor structure 100 without damage. In some embodiments, a porosity of the porous layer 33 is between 5% and 30%. In some embodiments, the porosity of the porous layer 33 is between 10% and 15%. In some embodiments, the porous layer 33 includes low-k material.

The porosity of the porous layer 33 can be determined by concentrations of decomposable porogen material and the base material of the energy-removable material 32. In order to form the porous layer 33 having the porosity between 5% and 30% (or between 10% and 15% as described above), the energy-removable material 32 may include a relatively low concentration of the decomposable porogen material and a relatively high concentration of the base material. For example, the energy-removable material 32 may include about 5% or greater of the decomposable porogen material, and about 95% or less of the base material. In another example, the energy-removable material 32 may include about 10% or greater of the decomposable porogen material, and about 90% or less of the base material. In another example, the energy-removable material 32 may include about 15% of the decomposable porogen material, and about 85% of the base material.

Figure 13:
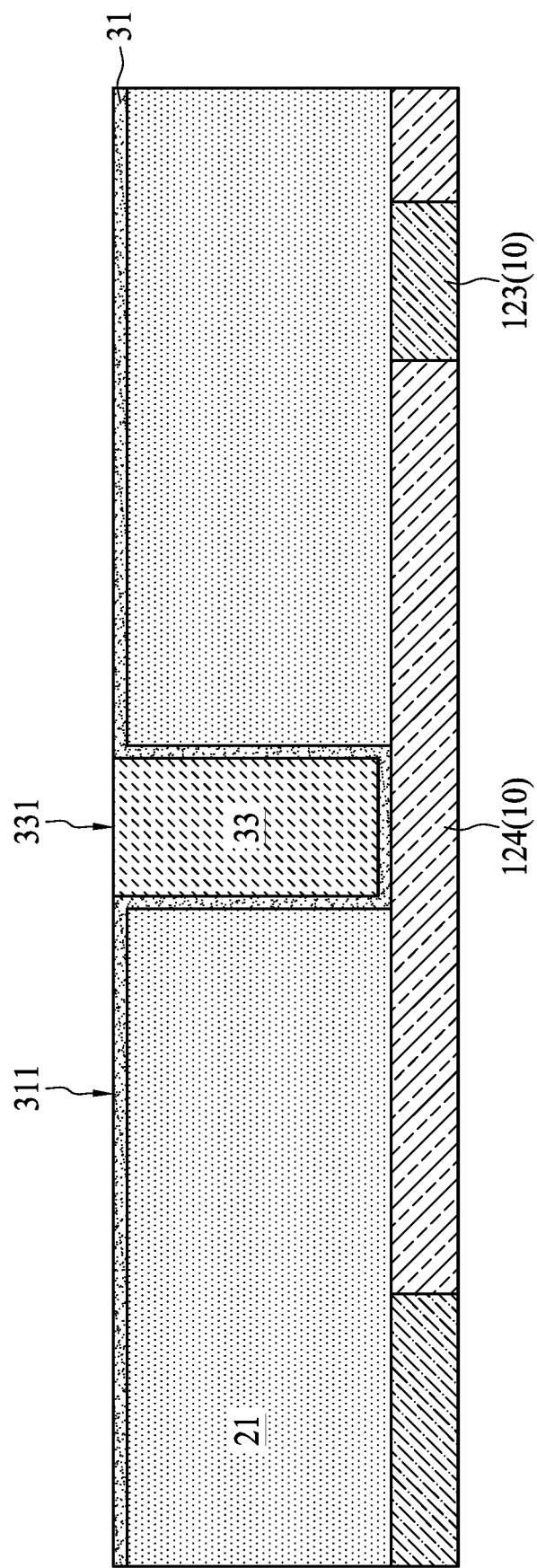

Referring to FIG. 13, FIG. 13 is a schematic cross-sectional diagram at a stage of the method S1 in accordance with some embodiments of the present disclosure. After the operation S14, an etch-back operation 81 is performed on the porous layer 33 as shown in FIG. 12. In some embodiments, a portion of the porous layer 33 above the first liner 31 or the dielectric layer 21 is removed. In some embodiments, the etch-back operation 81 stops when an exposure of the first liner 31 is detected. In some embodiments, a portion of the porous layer 33 in the opening 91 remains after the etch-back operation 81. In some embodiments, a top surface 331 of the remaining portion of the porous layer 33 is substantially aligned with the top surface 311 of the first liner 31. In some embodiments, the top surface 331 of the remaining portion of the porous layer 33 is substantially coplanar with the top surface 311 of the first liner 31. In some embodiments, the porous layer 33 has a pillar configuration after the etch-back operation 81. In some embodiments, the porous layer 33 is referred to as a porous pillar 33 after the etch-back operation 81.

It should be noted that a sequence of the operations as illustrated in FIGS. 9 to 11 can be altered to achieve a same resulting structure as shown in FIG. 11. In some embodiments, the energy treatment 71 can be performed after the etch-back operation 81. A portion of the energy-removable material 32 above the first liner 31 or the dielectric layer 21 may be removed by the etch-back operation 81. The energy treatment 71 is then performed on a remaining portion of the energy-removable material 32 disposed in the opening 91 to form the porous pillar 33 as shown in FIG. 13.

Figure 14:
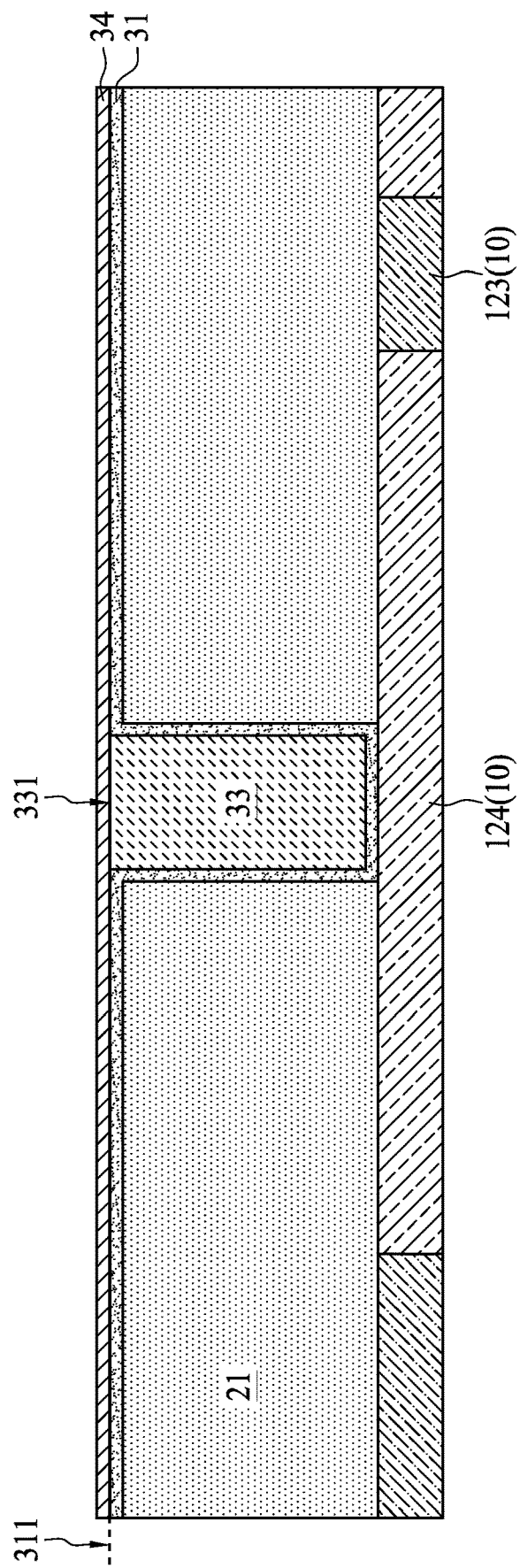

Referring to FIG. 14, FIG. 14 is a schematic cross-sectional diagram at a stage of the method S1 in accordance with some embodiments of the present disclosure. Prior to the operation S15, a second liner 34 is formed over the porous pillar 33. In some embodiments, a deposition is performed to form the second liner 34. In some embodiments, the second liner 34 is formed by a chemical vapor deposition (CVD), a physical vapor deposition (PVD), an atomic layer deposition (ALD), a low-pressure chemical vapor deposition (LPCVD), a plasma-enhanced CVD (PECVD), or a combination thereof. In some embodiments, the second liner 34 is formed by a blanket deposition. In some embodiments, the second liner 34 is disposed over the porous pillar 33 and the first liner 31. In some embodiments, the second liner 34 is in contact with the top surface 331 of the porous pillar 33 and the top surface 311 of the first liner 31. In some embodiments, the second liner 34 includes one or more dielectric materials. In some embodiments, the second liner 34 includes nitride, oxide, high-k material, or a combination thereof. In some embodiments, the second liner 34 includes silicon nitride. In some embodiments, a thickness of the second liner 34 is in a range of 1 to 50 nm for a purpose of moisture prevention. In some embodiments, the thickness of the second liner 34 is substantially consistent throughout the entire second liner 34. In some embodiments, the dielectric material of the second liner 34 is same as that of the first liner 31 for a purpose of etching for formation of a conductive via in a subsequent process. In some embodiments, the porous pillar 33 is encircled by the first liner 31 and the second liner 34.

Figure 15:
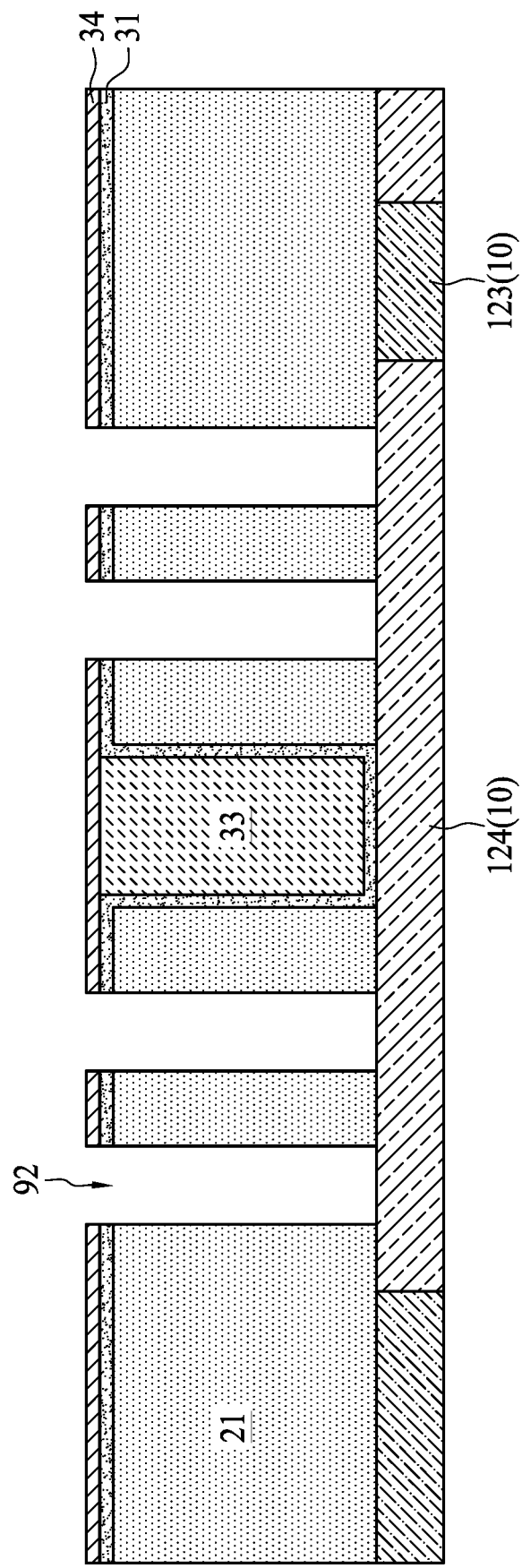

Referring to FIG. 15, FIG. 15 is a schematic cross-sectional diagram at a stage of the method S1 in accordance with some embodiments of the present disclosure. After the formation of the second liner 34 and prior to the operation S15, portions of the substrate 10 are exposed. In some embodiments, an etching operation is performed on the second liner 34, the first liner 31 and the dielectric layer 21.

In some embodiments, portions of the second liner 34, the first liner 31, and the dielectric layer 21 are removed by the etching operation. One or more openings 92 are formed by the etching operation. In some embodiments, one or more portions of the metal line 124 are exposed by the one or more openings 92. In some embodiments, the one or more openings 92 are defined by the substrate 10, the dielectric layer 21, the first liner 31, and the second liner 34. In some embodiments, the one or more openings 92 are separated from the porous pillar 33. In some embodiments, the one or more openings 92 extend through the dielectric layer 21. In some embodiments, the one or more openings 92 penetrate the dielectric layer 21, the first liner 31 and the second liner 34. In some embodiments with one opening 92, the opening 92 is adjacent to or surrounds the porous pillar 33. In some embodiments with multiple openings 92, the openings 92 are separated from one another.

In some embodiments, the openings 92 are formed by one or more etching operations. In some embodiments in which the openings 92 are formed by one etching operation, an etchant used in the etching operation has a low selectivity to the first liner 31, the second liner 34 and the dielectric layer 21. In some embodiments, the first liner 31 and the second liner 34 include a same material, which may benefit selection of the etchant of the etching operation(s). In some embodiments, the first liner 31, the second liner 34 and the dielectric layer 21 may be removed by a sequence of different etching operations. In some embodiments, each of the different etching operations having a high selectivity to a corresponding target layer (e.g., the first liner 31, the second liner 34 or the dielectric layer 21).

Figure 16:
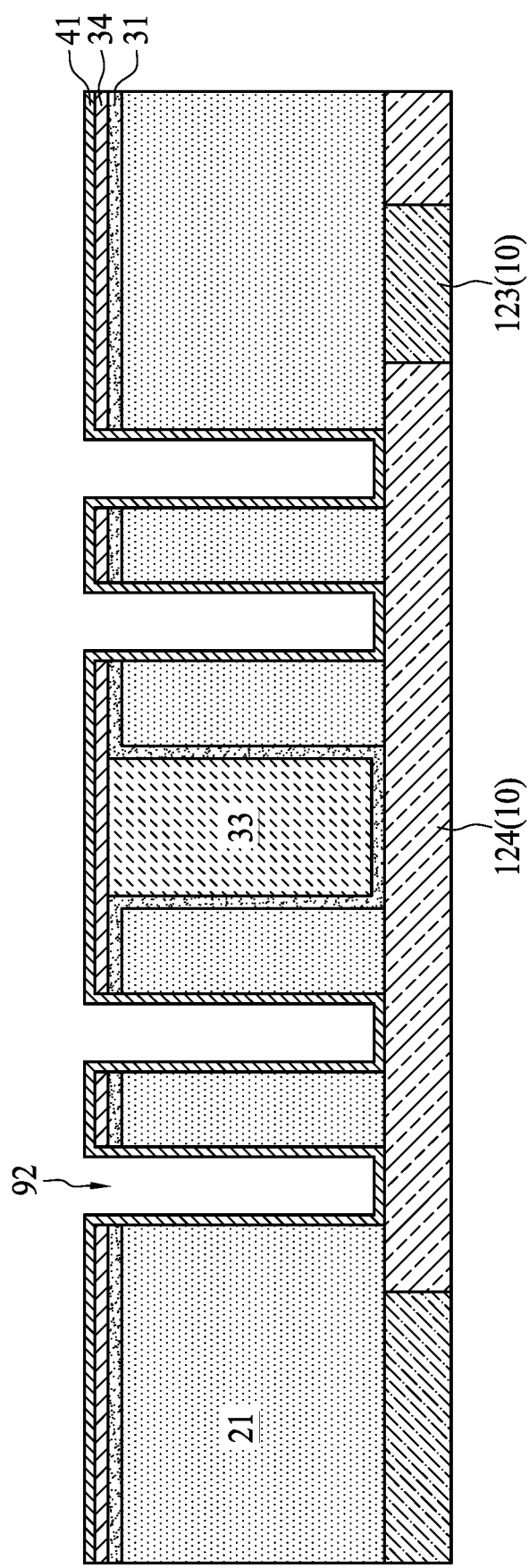

Referring to FIG. 16, FIG. 16 is a schematic cross-sectional diagram at a stage of the method S1 in accordance with some embodiments of the present disclosure. After the formation of the openings 92, a barrier layer 41 is formed conformal to the openings 92. In some embodiments, the barrier layer 41 lines the openings 92. In some embodiments, the barrier layer 41 covers the second liner 34. In some embodiments, the barrier layer 41 is formed by a conformal deposition. In some embodiments, the barrier layer 41 is formed by a chemical vapor deposition (CVD), a physical vapor deposition (PVD), an atomic layer deposition (ALD), a low-pressure chemical vapor deposition (LPCVD), a plasma-enhanced CVD (PECVD), or a combination thereof. In some embodiments, the barrier layer 41 includes titanium, tantalum, a nitride thereof, an alloy thereof, or a combination thereof. In some embodiments, the barrier layer 41 can be a multi-layered structure. In some embodiments, the barrier layer 41 includes a titanium sub-layer and a titanium nitride sub-layer. However, the invention is not limited thereto.

Figure 17:
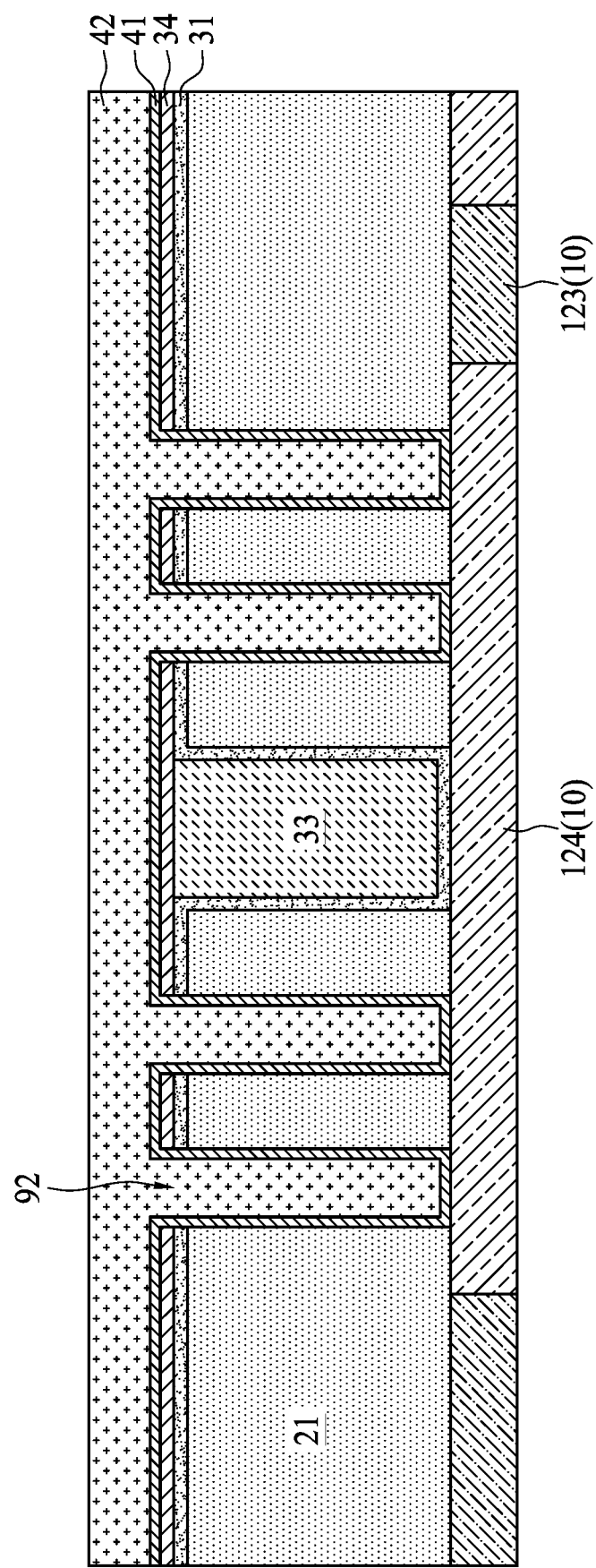

Referring to FIG. 17, FIG. 17 is a schematic cross-sectional diagram at a stage of the method S1 in accordance with some embodiments of the present disclosure. After the formation of the barrier layer 41, a conductive material 42 is formed over the barrier layer 41. In some embodiments, the conductive material 42 fills the openings 92 and is disposed over the barrier layer 41. In some embodiments, the conductive material 42 includes one or more metals, such as tungsten, copper, cobalt, ruthenium, molybdenum, titanium, tantalum, nickel, platinum, erbium, a combination thereof, an alloy thereof, or a combination of alloys thereof. In some embodiments, the conductive material 42 includes tungsten, copper, or a combination thereof. In some embodiments, the conductive material 42 is formed by a chemical vapor deposition (CVD), a physical vapor deposition (PVD), an atomic layer deposition (ALD), a low-pressure chemical vapor deposition (LPCVD), a plasma-enhanced CVD (PECVD), electroplating, electroless plating, sputtering, or a combination thereof.

Figure 18:
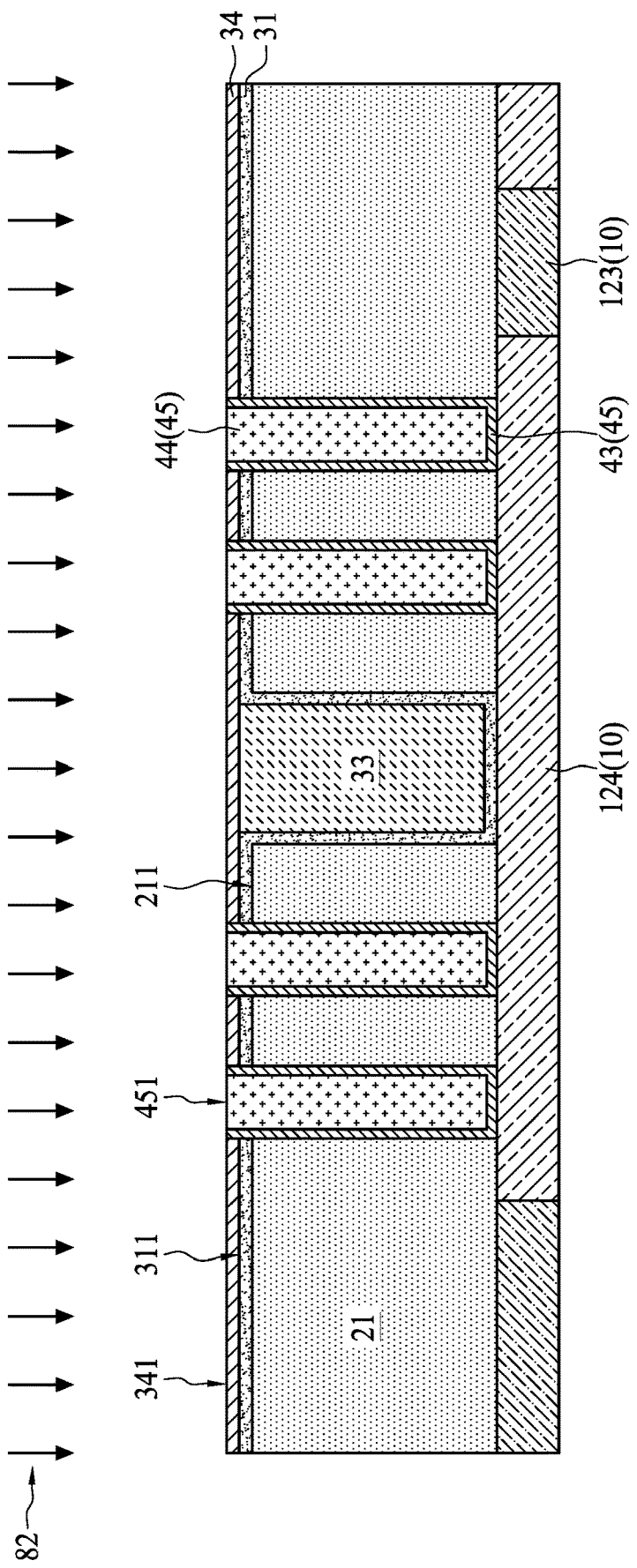

Referring to FIG. 18, FIG. 18 is a schematic cross-sectional diagram at a stage of the method S1 in accordance with some embodiments of the present disclosure. In the operation S15, an etch-back operation 82 is performed on the conductive material 42 and the barrier layer 41 shown in FIG. 17 to form one or more conductive vias 45 shown in FIG. 18. In some embodiments, portions of the conductive material 42 and the barrier layer 41 above the second liner 34 are removed by the etch-back operation 82. In some embodiments, one or more portions of the conductive material 42 remaining in the openings 92 become one or more conductive members 44. In some embodiments, the portions of the barrier layer 41 remaining in the openings 92 become one or more barrier members 43. In some embodiments, the barrier members 43 and the conductive members 44 together become the one or more conductive vias 45. In some embodiments, each of the conductive vias 45 includes a conductive member 44 and a barrier member 43. In some embodiments, the barrier member 43 surrounds the conductive member 44. In some embodiments, the conductive member 44 is separated from the dielectric layer 21, the first liner 31 or the second liner 34 by the barrier member 43. In some embodiments, a top surface 451 of the conductive via 45 is at a vertical level above the top surface 211 of the dielectric layer 21 or the top surface 311 of the first liner 31. In some embodiments, the top surface 451 of the conductive via 45 is substantially aligned with a top surface 341 of the second liner 34.

Figure 19:
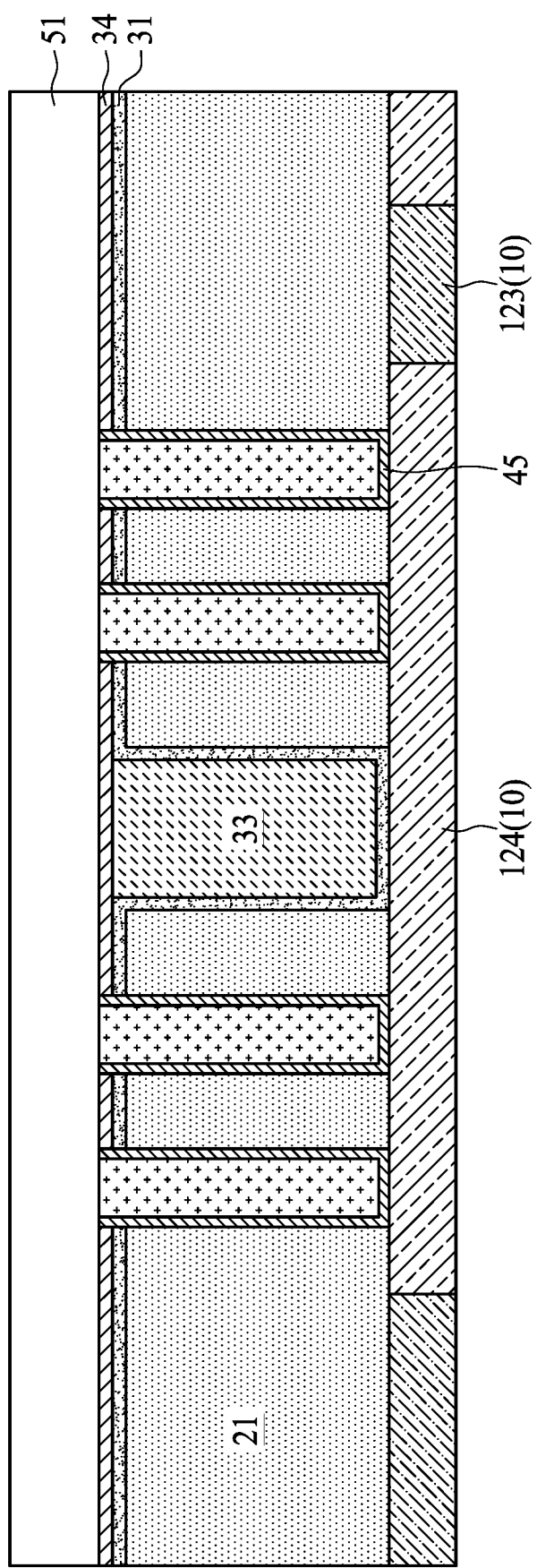

Referring to FIG. 19, FIG. 19 is a schematic cross-sectional diagram at a stage of the method S1 in accordance with some embodiments of the present disclosure. Prior to the operation S16, a contact material 51 is formed over the dielectric layer 21. In some embodiments, the contact material 51 is disposed over the porous pillar 33, the conductive vias 45 and the second liner 34. In some embodiments, the contact material 51 include one or more metals, such as tungsten, copper, aluminum, cobalt, ruthenium, molybdenum, titanium, tantalum, nickel, platinum, erbium, a combination thereof, an alloy thereof, or a combination of alloys thereof. In some embodiments, the contact material 51 includes aluminum. In some embodiments, the contact material 51 is formed by a chemical vapor deposition (CVD), a physical vapor deposition (PVD), a low-pressure chemical vapor deposition (LPCVD), a plasma-enhanced CVD (PECVD), electroplating, electroless plating, sputtering, or a combination thereof. In some embodiments, the contact material 51 is separated from the porous pillar 33 by the second liner 34.

Figure 20:
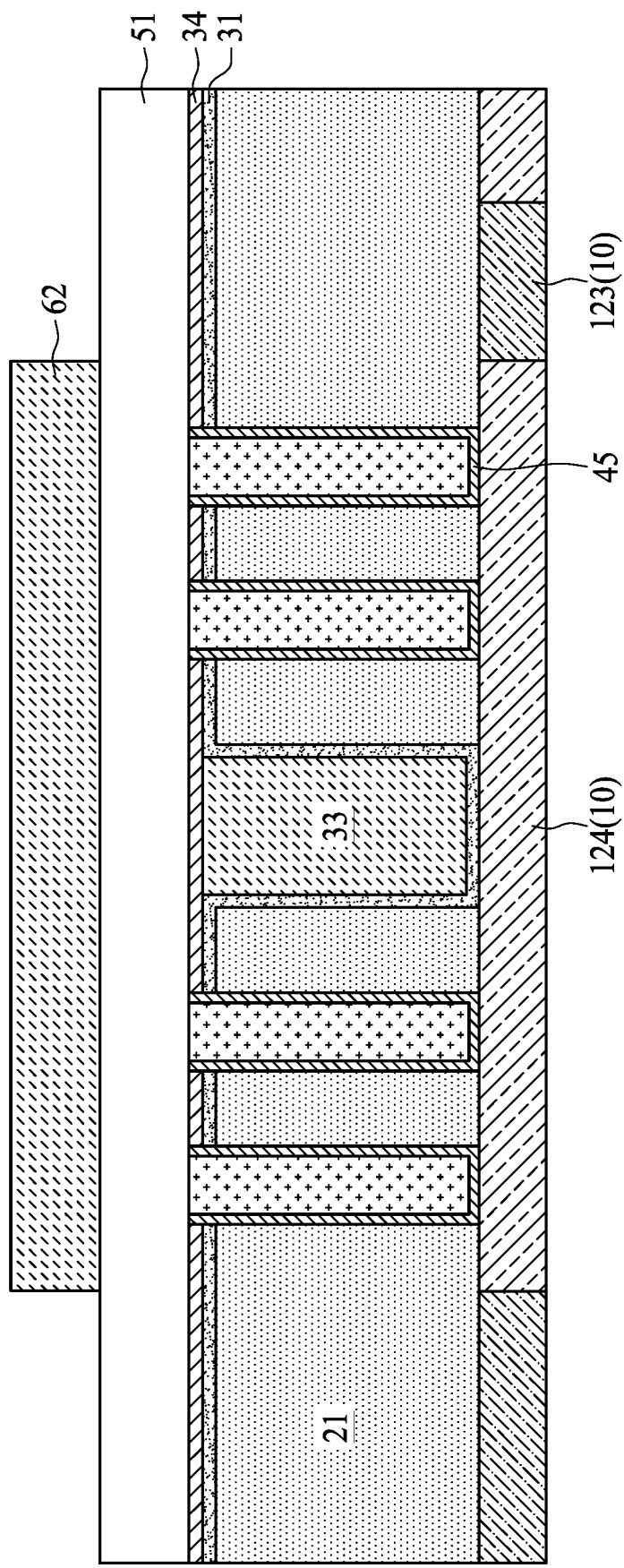

Referring to FIG. 20, FIG. 20 is a schematic cross-sectional diagram at a stage of the method S1 in accordance with some embodiments of the present disclosure. Prior to the operation S16, a photoresist layer 62 is formed over the contact material 51. In some embodiments, a portion of the contact material 51 is defined by and exposed through the photoresist layer 62. The photoresist layer 62 is configured to protect portions of the dielectric layer 21 covered by the photoresist layer 62 during a patterning operation that is subsequently performed.

Figure 21:
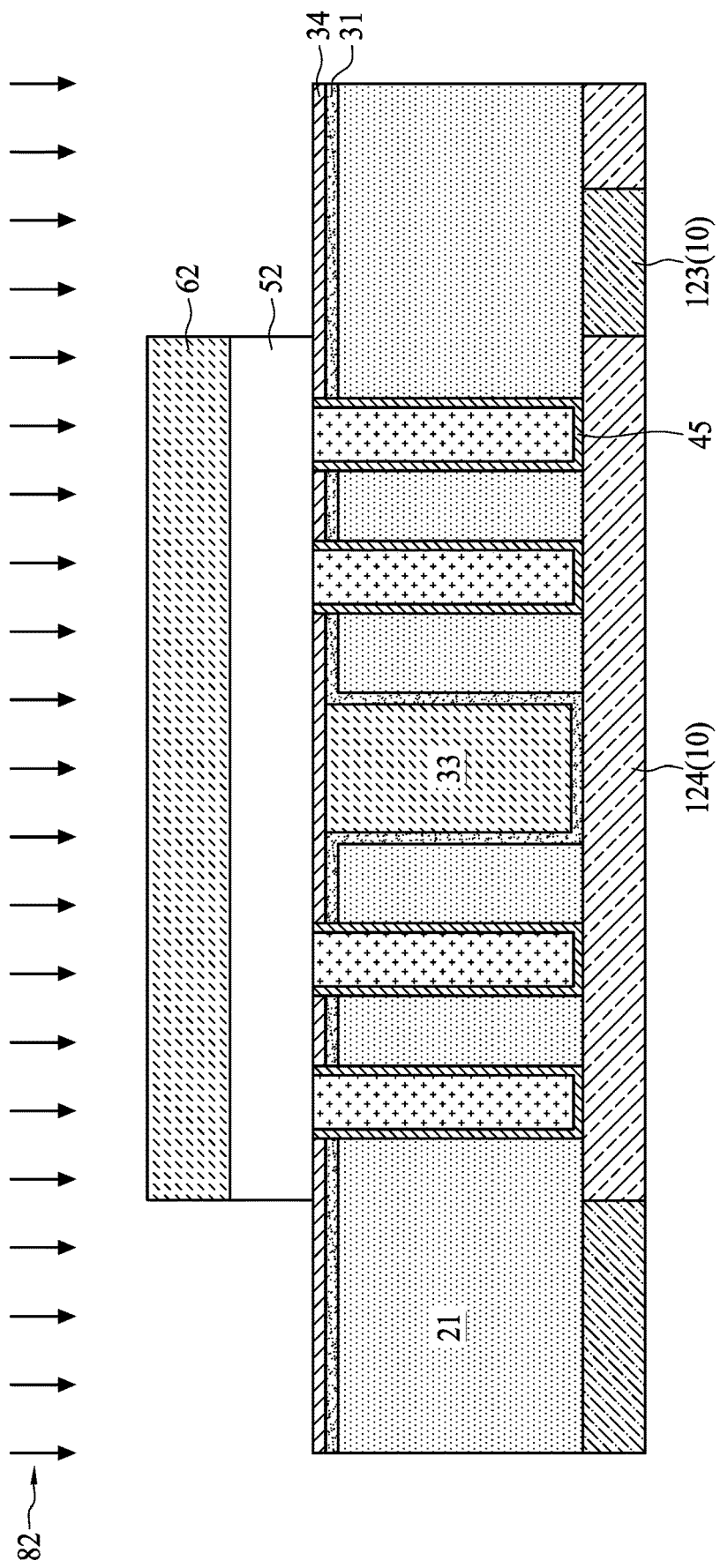

Referring to FIG. 21, FIG. 21 is a schematic cross-sectional diagram at a stage of the method S1 in accordance with some embodiments of the present disclosure. In the operation S16, the contact material 51 is patterned to form a conductive pad 52. In some embodiments, a portion of the contact material 51 exposed through the photoresist layer 62 is removed by a patterning operation 82. In some embodiments, the patterning operation 82 includes ion beam etching, directional dry etching, reactive ion etching, or a combination thereof. In some embodiments, the patterning operation 82 of the contact material 51 includes a dry etching operation. In some embodiments, the dry etching operation stops at an exposure of the second liner 34 (or an exposure of the material of the second liner 34).

In some embodiments, the conductive pad 52 at least covers the porous pillar 33 and the conductive vias 45. In some embodiments, the conductive pad 52 covers an entirety of the porous pillar 33 and an entirety of the conductive vias 45. In some embodiments, the conductive pad 52 is electrically connected to the conductive vias 45. In some embodiments, the conductive pad 52 is in physical contact with the conductive vias 45. In some embodiments, the conductive pad 52 is electrically connected to the metal line 124 of the interconnection structure 12 of the substrate 10 through the conductive vias 45.

Figure 22:
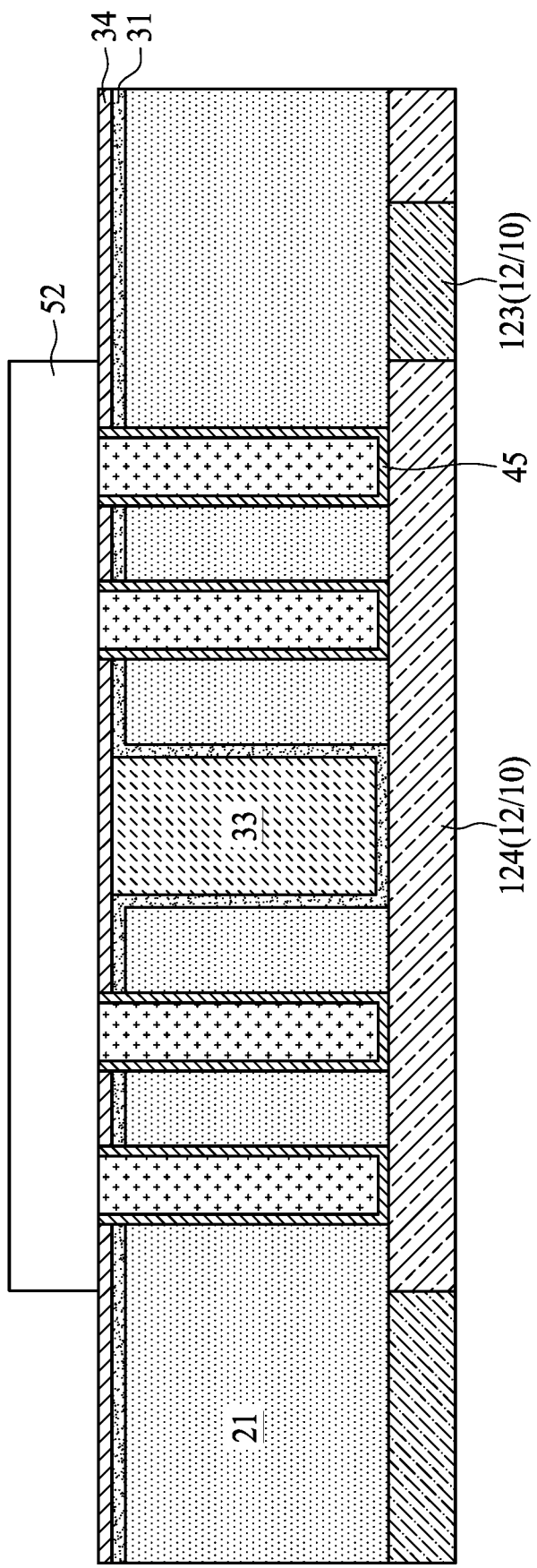

Referring to FIG. 22, FIG. 22 is a schematic cross-sectional diagram at a stage of the method S1 in accordance with some embodiments of the present disclosure. After the operation S16, the photoresist layer 62 is removed. In some embodiments, a wet etching operation is performed to remove the photoresist layer 62. In some embodiments, a post-cleaning operation is optionally performed after the removal of the photoresist layer 62.

Figure 23:
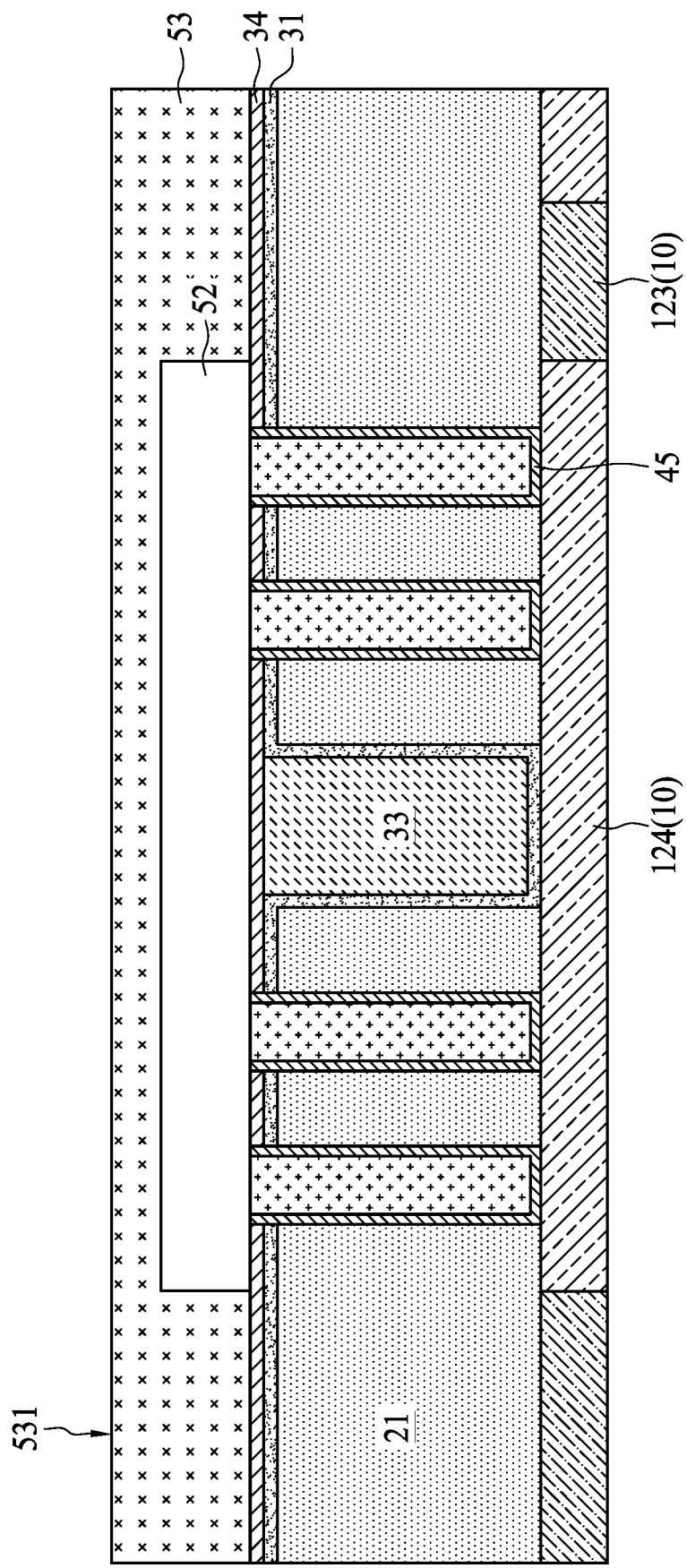

Referring to FIG. 23, FIG. 23 is a schematic cross-sectional diagram at a stage of the method S1 in accordance with some embodiments of the present disclosure. After the removal of the photoresist layer 62, a passivation material 53 is formed over the conductive pad 52. In some embodiments, the passivation material 53 is disposed over the conductive pad 52 and the second liner 34. In some embodiments, the passivation material 53 contacts the conductive pad 52 and the second liner 34. In some embodiments, the passivation material 53 is in contact with the conductive pad 52 and the second liner 34. In some embodiments, the passivation material 53 covers an entirety of the conductive pad 52. In some embodiments, a top surface 531 of the passivation material 53 is substantially planar. In other embodiments, the top surface 531 of the passivation material 53 is conformal to a profile of the conductive pad 52 and the second liner 34 depending on a forming method of the passivation material 53.

Figure 24:
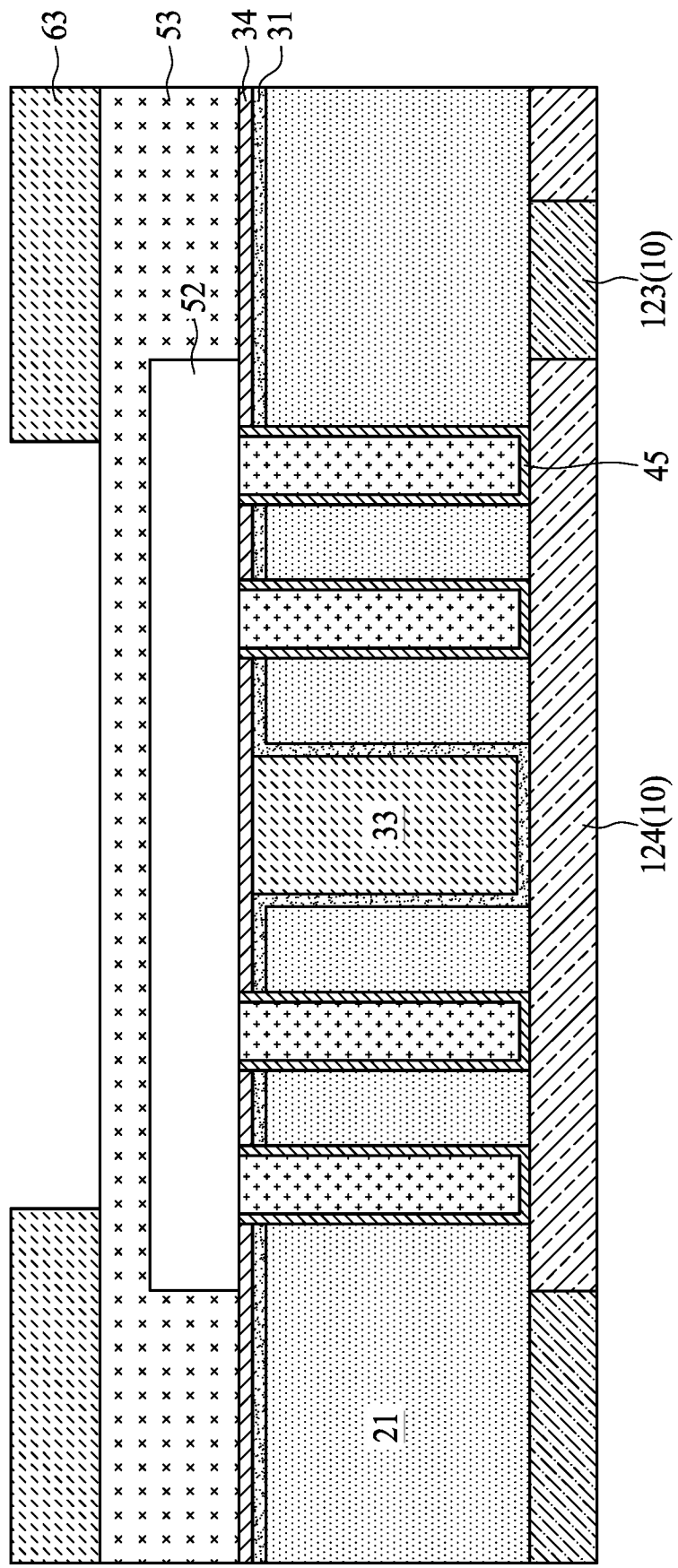

Referring to FIG. 24, FIG. 24 is a schematic cross-sectional diagram at a stage of the method S1 in accordance with some embodiments of the present disclosure. After the formation of the passivation material 53, a photoresist layer 63 is formed over the passivation material 53. In some embodiments, a portion of the passivation material 53 is defined by and exposed through the photoresist layer 63. The photoresist layer 63 is configured to protect portions of the passivation material 53 covered by the photoresist layer 63 during a patterning operation that is subsequently performed.

Figure 25:
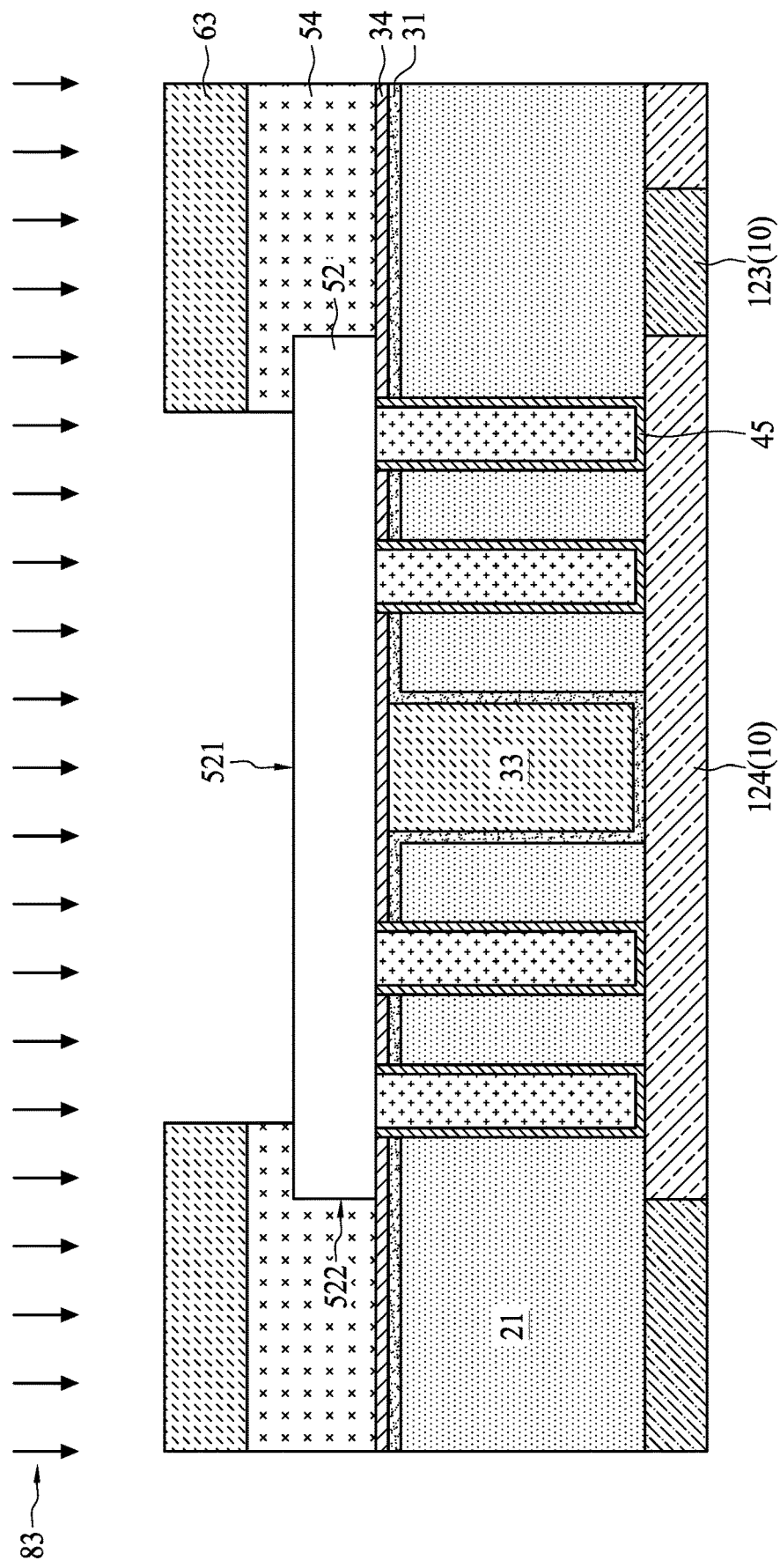

Referring to FIG. 25, FIG. 25 is a schematic cross-sectional diagram at a stage of the method S1 in accordance with some embodiments of the present disclosure. After the formation of the photoresist layer 63, the passivation material 53 is patterned to form a passivation layer 54. In some embodiments, a portion of the passivation material 53 exposed through the photoresist layer 63 is removed by a patterning operation 83. In some embodiments, the patterning operation 83 includes ion beam etching, directional dry etching, reactive ion etching, or a combination thereof. In some embodiments, the patterning operation 83 on the passivation material 53 includes a dry etching operation. In some embodiments, the dry etching operation stops at an exposure of the passivation material 53 (or the passivation layer 54).

In some embodiments, at least a portion of the conductive pad 52 is exposed through the passivation layer 54. In some embodiments, at least a portion of a top surface 521 of the conductive pad 52 is exposed through the passivation layer 54. As shown in FIG. 25, the passivation layer 54 covers a periphery of the top surface 521 of the conductive pad 52. In other embodiments, an entirety of the top surface 521 of the conductive pad 52 is exposed through the passivation layer 54. In some embodiments, the passivation layer 54 at least covers a sidewall 522 of the conductive pad 52. The exposure of at least the portion of the top surface 521 of the conductive pad 52 is for a purpose of electrical connection to another electrical component or electrical device.

Figure 26:
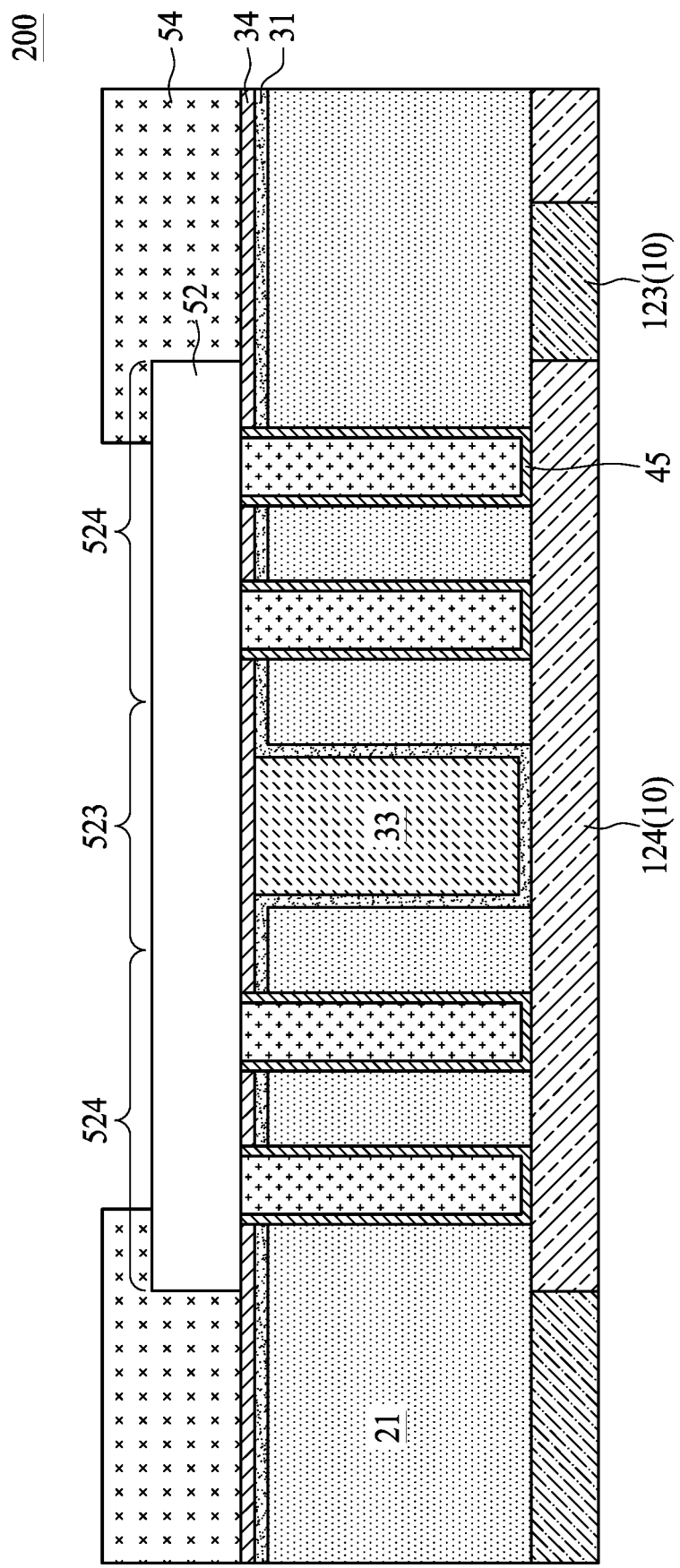

Referring to FIG. 26, FIG. 26 is a schematic cross-sectional diagram at a stage of the method S1 in accordance with some embodiments of the present disclosure. After the patterning operation 83 shown in FIG. 25, the photoresist layer 63 is removed. In some embodiments, a wet etching operation is performed to remove the photoresist layer 63. In some embodiments, a post-cleaning operation is optionally performed after the removal of the photoresist layer 63.

As shown in FIG. 26, the semiconductor structure 200 similar to the semiconductor structure 100 is thereby formed. In some embodiments, the porous pillar 33 is designed to be in a central region 523 of the conductive pad 52, and the conductive vias 45 are designed to be in a peripheral region 524 of the conductive pad 52. In some embodiments, a top-view perspective of the conductive pad 52 of the semiconductor structure 200 shown in FIG. 26 can be similar to that shown in FIG. 2, wherein the structure shown in FIG. 26 can be a cross section along the line A-A'. However, a configuration of the conductive vias 45 from a top view is not limited herein.

Figure 27:
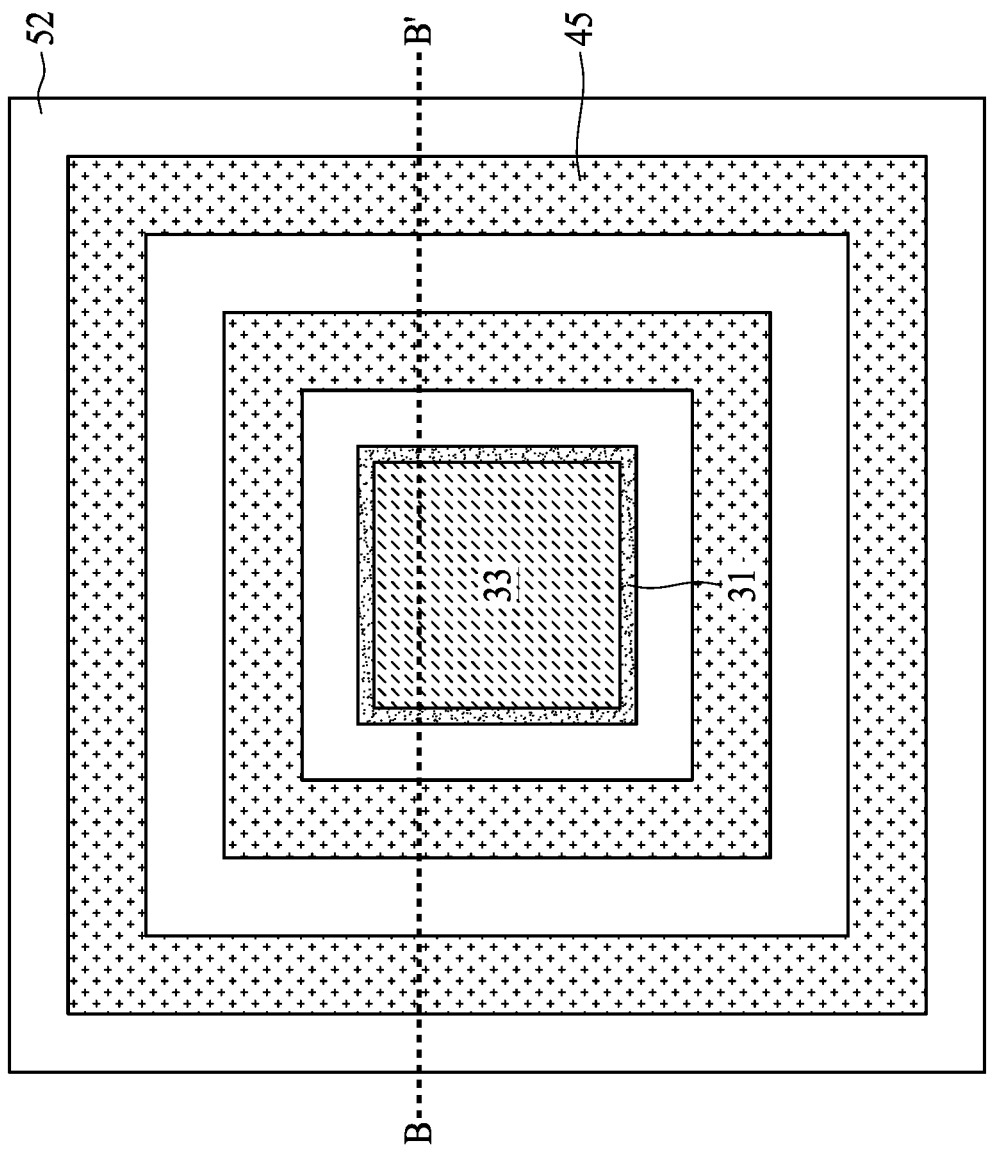
FIG. 27 is a schematic top-view perspective of a semiconductor structure in accordance with some embodiments of the present disclosure.

Referring to FIG. 27, FIG. 27 is a schematic top-view perspective showing the conductive pad 52, the porous pillar 33, the first liner 31 and the conductive vias 45 of the semiconductor structure 200 in accordance with some embodiments of the present disclosure. In some embodiments, the semiconductor structure 200 shown in FIG. 26 can be a cross section along a line B-B' shown in FIG. 27. In some embodiments, each of the conductive vias 45 has a ring shape. In some embodiments, each of the conductive vias 45 has a configuration of a square ring. In some embodiments, each of the conductive vias 45 surrounds the porous pillar 33 and/or the first liner 31. In some embodiments, each of the conductive vias 45 encircles the porous pillar 33 and/or the first liner 31. In some embodiments, a top cross-sectional area of the conductive vias 45 is substantially greater than a top cross-sectional area of the porous pillar 33 for a purpose of lower electrical resistance and better electrical conductivity.

The present disclosure provides a semiconductor structure and a method of manufacturing the same. The semiconductor structure of the present disclosure includes a porous structure, especially between a topmost metal layer of an interconnection structure and a conductive pad covered by a passivation layer. The porous structure provides a function of absorbing stress on the semiconductor structure (e.g., bonding stress during a manufacturing process), and a force tolerance of the semiconductor structure can be improved. Therefore, damage or defect resulting from force or stress on the semiconductor structure (e.g., during a bonding process of the semiconductor structure with another chip, wafer or electrical structure) can be prevented. A product yield and performance can be thereby improved.

FIGS. 28 to 31 are schematic diagrams illustrating various fabrication stages constructed according to the method S1 for manufacturing a semiconductor structure 300 in accordance with alternative embodiments of the present disclosure. The stages shown in FIGS. 28 to 31 are also illustrated schematically in the process flow in FIG. 3. In subsequent discussion, the fabrication stages shown in FIGS. 28 to 31 are discussed in reference to the process steps in FIG. 3.

For ease of illustration, reference numerals with similar or same functions and properties are repeated in different embodiments and figures. For a purpose of brevity, in following specification, only differences from the embodiments illustrated above are emphasized, and descriptions of similar or same elements, functions, properties and/or processing are omitted.

Figure 28:
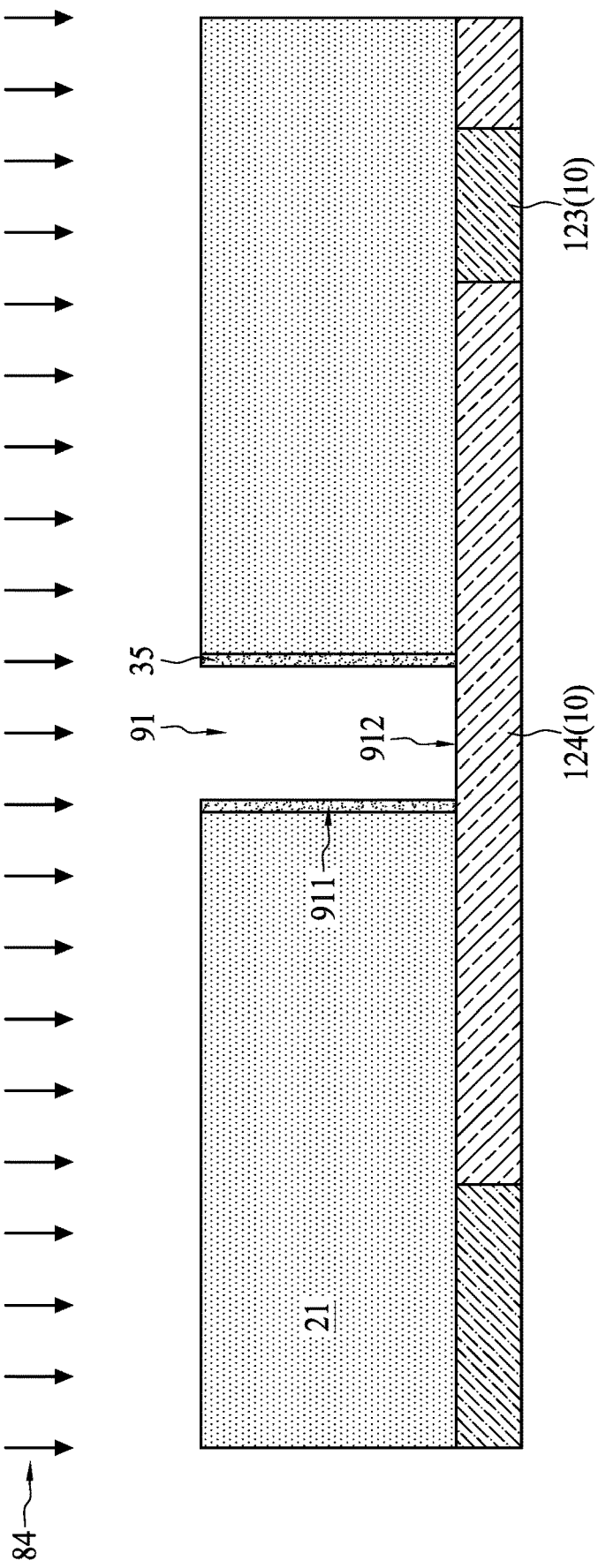
FIGS. 28 to 31 are cross-sectional diagrams of intermediate stages in the formation of a semiconductor structure in accordance with some embodiments of the present disclosure.

Referring to FIG. 28, FIG. 28 is a schematic cross-sectional diagram at a stage of the method S1 in accordance with some embodiments of the present disclosure. In some embodiments, an etching operation 84 is performed on the first liner 31 of the intermediate structure as shown in FIG. 9 prior to the formation of the energy-removable material 32. In some embodiments, the etching operation 84 includes a directional etching operation. In some embodiments, horizontal portions of the first liner 31 above the dielectric layer 21 and in the opening 91 are removed. In some embodiments, remaining portions of the first liner 31 become a third liner 35. In some embodiments, the third liner 35 lines a sidewall 911 of the opening 91. In some embodiments, a portion of the substrate (or the metal line 124 of the substrate 10) is exposed after the etching operation 84. In other words, a bottom surface 912 of the opening 91 may be exposed after the etching operation 84.

Figure 29:
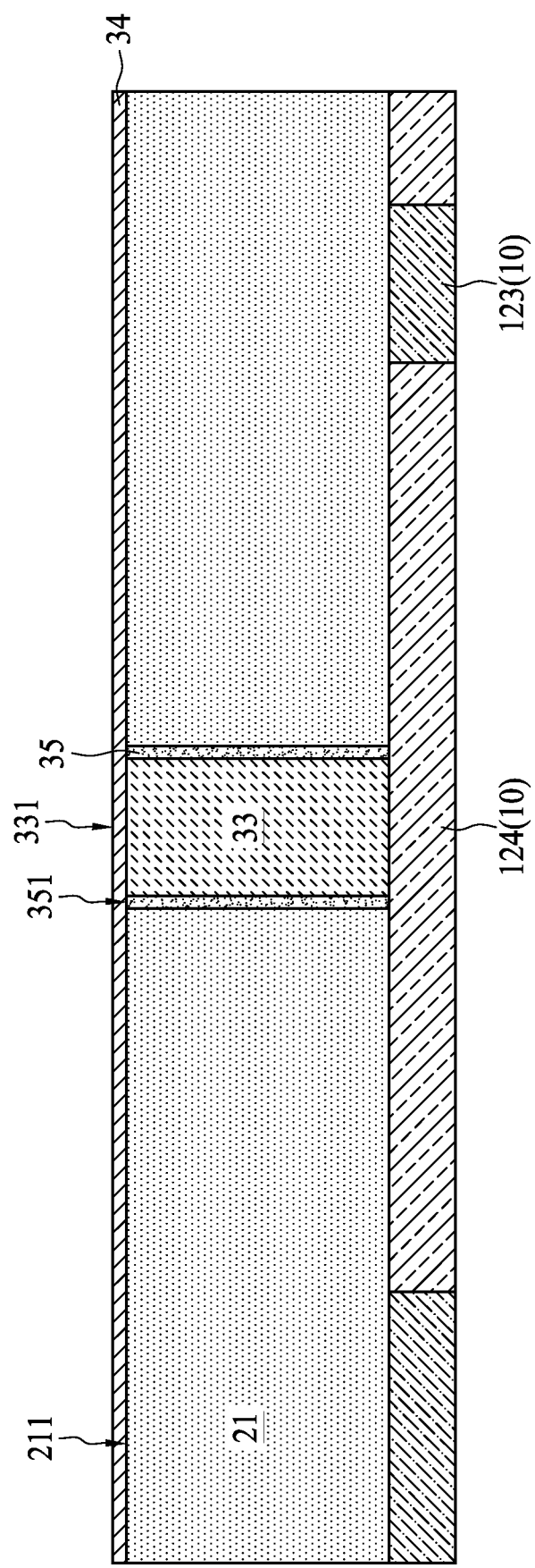

Referring to FIG. 29, FIG. 29 is a schematic cross-sectional diagram at a stage of the method S1 in accordance with some embodiments of the present disclosure. Operations similar to those illustrated in FIGS. 10 to 14 are applied to the intermediate structure as shown in FIG. 28, and a second liner 34 is formed over a porous pillar 33, the third liner 35, and a dielectric layer 21. In some embodiments, a top surface 331 of the porous pillar 33 is substantially aligned with a top surface 211 of the dielectric layer 21 and/or a top surface 351 of the third liner 35. In some embodiments, the top surface 331 of the porous pillar 33 is substantially coplanar with the top surface 211 of the dielectric layer 21 and/or the top surface 351 of the third liner 35. In some embodiments, the second liner 34 contacts the top surface 211 of the dielectric layer 21.

Figure 30:
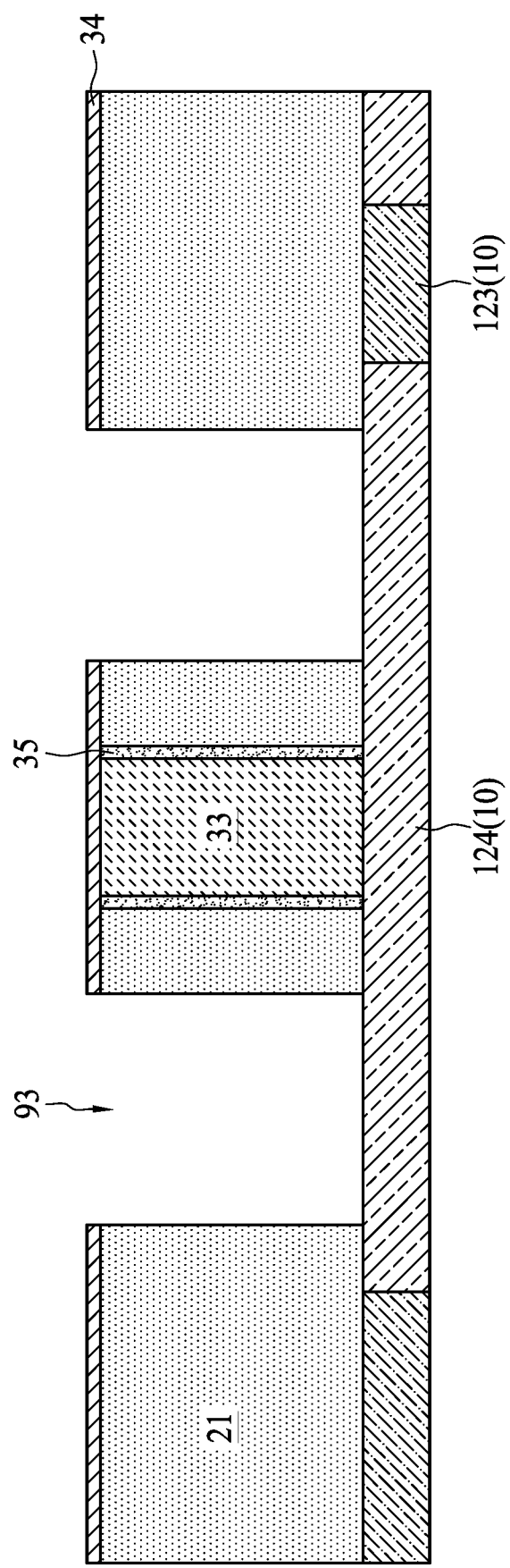

Referring to FIG. 30, FIG. 30 is a schematic cross-sectional diagram at a stage of the method S1 in accordance with some embodiments of the present disclosure. Operations similar to those illustrated in FIG. 15 are applied to the intermediate structure as shown in FIG. 29, and an opening 93 is formed. In some embodiments, the opening 93 surrounds the porous pillar 33 and the third liner 35 (further illustration is provided in the following description). In some embodiments, the opening 93 is defined by the dielectric layer 21 and the second liner 34.

Figure 31:
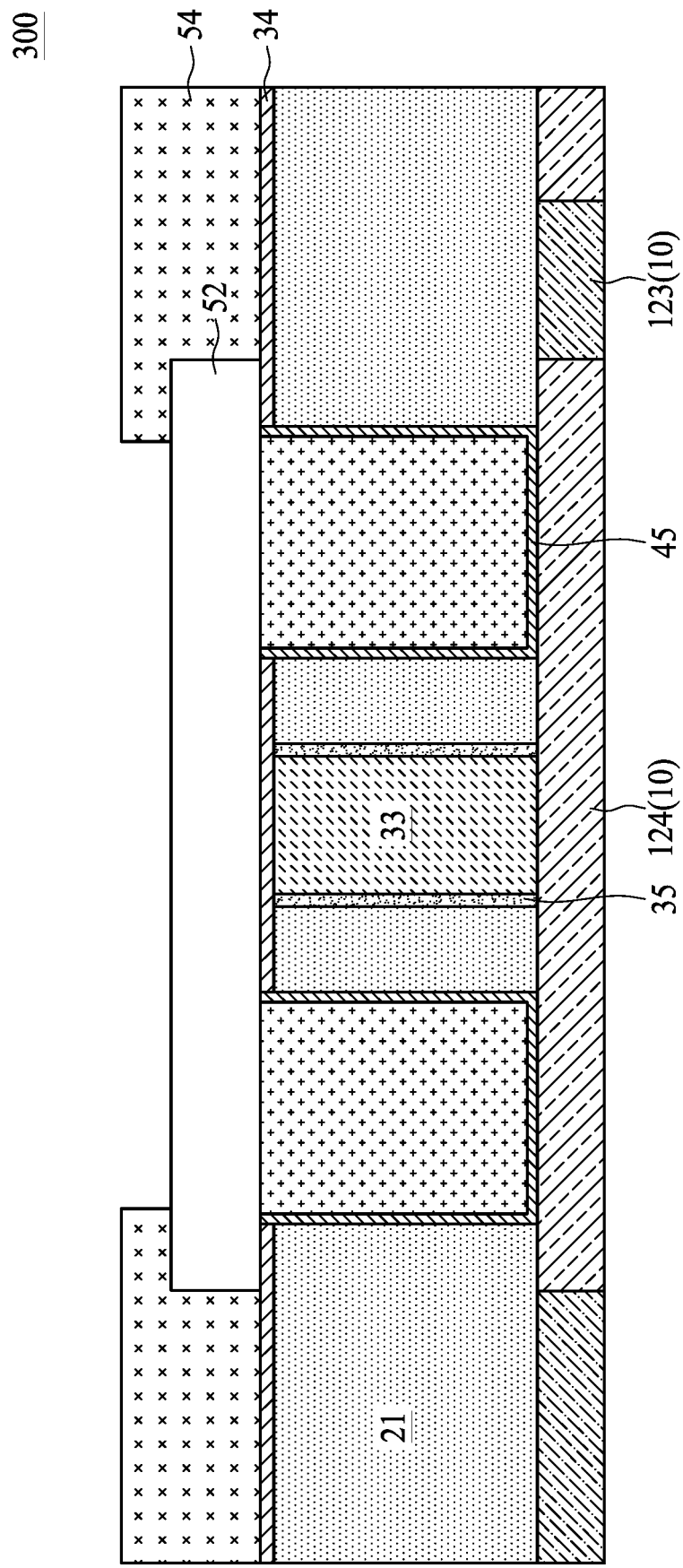

Referring to FIG. 31, FIG. 31 is a schematic cross-sectional diagram at a stage of the method S1 in accordance with some embodiments of the present disclosure. Operations similar to those illustrated in FIGS. 16 to 26 are applied to the intermediate structure as shown in FIG. 30, and a semiconductor structure 300 is thereby formed. In some embodiments, one conductive via 45 surrounding the porous pillar 33 is formed.

Figure 32:
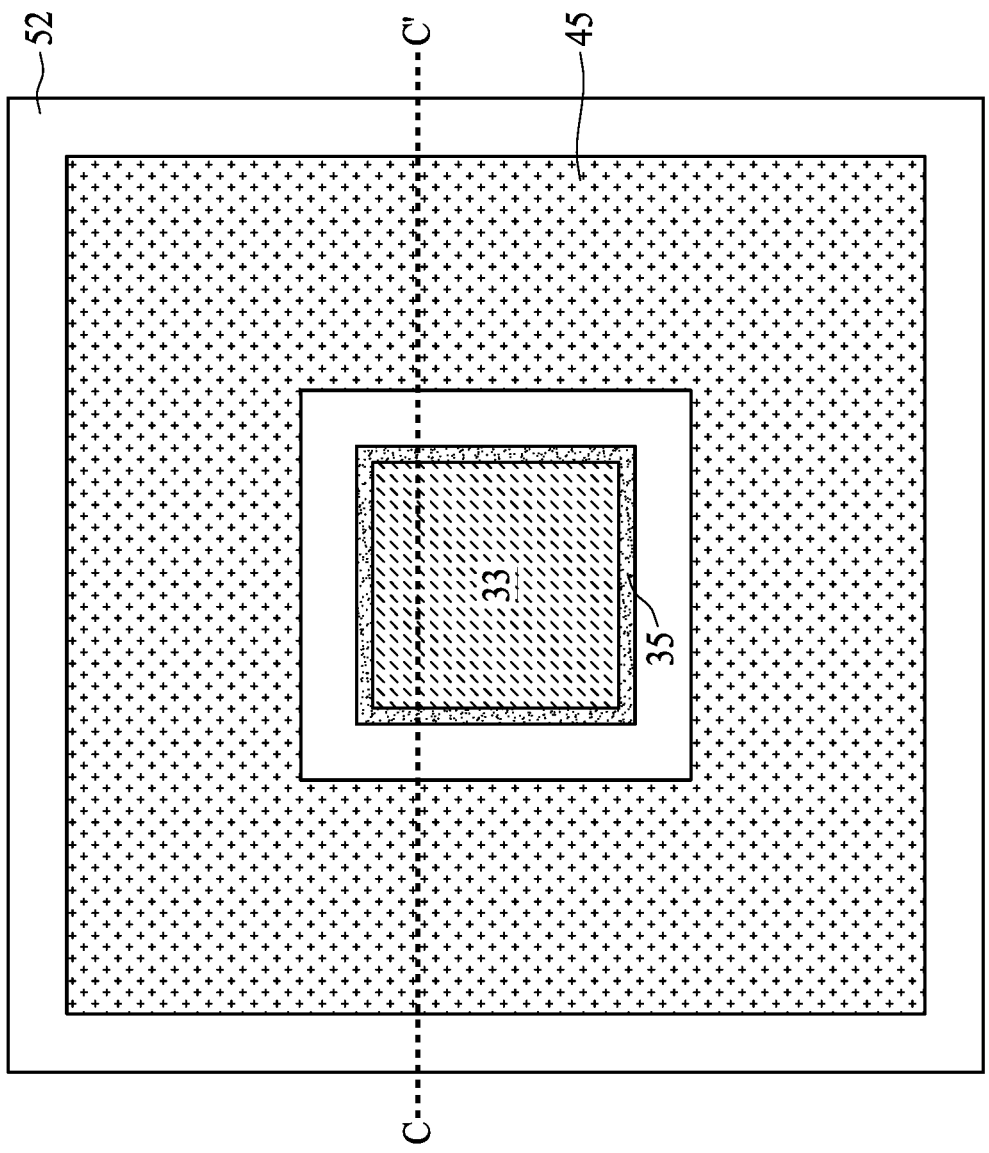
FIG. 32 is a schematic top-view perspective of a semiconductor structure in accordance with some embodiments of the present disclosure.

Referring to FIG. 32, FIG. 32 is a schematic top-view perspective showing the conductive pad 52, the porous pillar 33, the third liner 35 and the conductive via 45 of the semiconductor structure 300 in accordance with some embodiments of the present disclosure. In some embodiments, the semiconductor structure 300 shown in FIG. 31 can be a cross section along a line C-C' shown in FIG. 32. In some embodiments, the semiconductor structure 300 includes only a single conductive via 45. In some embodiments, the conductive via 45 surrounds or encircles the porous pillar 33 and the third liner 35. It should be noted that a configuration of the conductive via 45 and a configuration of the porous pillar 33 are not limited herein. In the embodiments shown in FIG. 32, the conductive via 45 is a rectangular ring encircling a rectangular porous pillar 33. In other embodiments, both the conductive via 45 and the porous pillar 33 can be a circle and the conductive via 45 can be a circular ring or a polygonal ring. In some embodiments, a shape of the conductive via 45 can correspond to a shape of the porous pillar 33 as shown in FIG. 32. In other embodiments, the shapes of the conductive via 45 and the porous pillar 33 can be different.

One aspect of the present disclosure provides a semiconductor structure. The semiconductor structure includes: a substrate including an interconnection structure; a dielectric layer disposed over the substrate; a porous pillar, disposed over the substrate and extending through the dielectric layer; a first moisture-preventing layer, surrounding the porous pillar and disposed within the dielectric layer; a conductive via, extending within the dielectric layer and disposed adjacent to the porous pillar; and a conductive pad, disposed over the dielectric layer and covering the conductive via and the porous pillar.

Another aspect of the present disclosure provides a method of manufacturing a semiconductor structure. The method includes: forming a dielectric layer over a substrate; forming an opening in the dielectric layer; forming a first liner conformal to the opening; forming a porous layer in the opening and surrounded by the first liner; forming a conductive via penetrating the dielectric layer; and forming a conductive pad over the dielectric layer, wherein the conductive pad covers the porous layer and the conductive via.

In conclusion, the application discloses a manufacturing method of a semiconductor structure and a semiconductor structure thereof. The semiconductor structure of the present disclosure includes a porous structure, especially between a topmost metal layer of an interconnection structure and a conductive pad covered by a passivation layer. The porous structure provides a function of absorbing stress on the semiconductor structure (e.g., bonding stress during a manufacturing process), and a force tolerance of the semiconductor structure can be improved. Therefore, damage or defect resulting from force or stress on the semiconductor structure (e.g., during a bonding process of the semiconductor structure with another chip, wafer or electrical structure) can be prevented. A product yield and performance can be thereby improved.

Although the present disclosure and its advantages have been described in detail, it should be understood that various changes, substitutions and alterations can be made herein without departing from the spirit and scope of the disclosure as defined by the appended claims. For example, many of the processes discussed above can be implemented in different methodologies and replaced by other processes, or a combination thereof.

Moreover, the scope of the present application is not intended to be limited to the particular embodiments of the process, machine, manufacture, composition of matter, means, methods and steps described in the specification. As one of ordinary skill in the art will readily appreciate from the present disclosure, processes, machines, manufacture, compositions of matter, means, methods or steps, presently existing or later to be developed, that perform substantially the same function or achieve substantially the same result as the corresponding embodiments described herein, may be utilized according to the present disclosure. Accordingly, the appended claims are intended to include within their scope such processes, machines, manufacture, compositions of matter, means, methods and steps.

What is claimed is:

1. A semiconductor structure, comprising:
   a substrate, including an interconnection structure;
   a dielectric layer, disposed over the substrate;
   a conductive pad, disposed over the dielectric layer;
   a passivation layer, disposed over the dielectric layer and partially exposing the conductive pad;
   a porous layer, surrounded by the dielectric layer and extending between the substrate and the conductive pad; and
   a first liner, surrounding the porous layer and disposed within the dielectric layer, wherein the first liner at least partially surrounds a sidewall and a bottom surface of the porous layer.

2. The semiconductor structure of claim 1, wherein the first liner surrounds a sidewall of the porous layer, and the porous layer contacts the substrate.

3. The semiconductor structure of claim 1, further comprising:
   a conductive via, disposed adjacent to the porous layer and electrically connecting the conductive pad to the interconnection structure.

4. The semiconductor structure of claim 3, wherein a portion of the dielectric layer is disposed between the conductive via and the porous layer.

5. The semiconductor structure of claim 3, wherein a top cross-sectional area of the conductive via is substantially greater than a top cross-sectional area of the porous layer.

6. The semiconductor structure of claim 3, wherein the conductive via extends through the dielectric layer.

7. The semiconductor structure of claim 3, wherein the conductive via includes a plurality of conductive vias, and the plurality of conductive vias are separated from one another, and the plurality of conductive vias are covered by the conductive pad.

8. The semiconductor structure of claim 1, wherein a porosity of the porous layer is between 5% and 30%.

9. The semiconductor structure of claim 1, wherein a porosity of the porous layer is between 10% and 15%.

10. The semiconductor structure of claim 1, further comprising:
    a second liner, disposed between the porous layer and the conductive pad, wherein the porous layer is encircled by the first liner and the second liner.

11. The semiconductor structure of claim 1, wherein the porous layer is disposed in a central region of the conductive pad from a top view perspective.

12. A semiconductor structure, comprising:
    a substrate, including an interconnection structure;
    a dielectric layer, disposed over the substrate;
    a porous pillar, disposed over the substrate and extending through the dielectric layer;
    a first moisture-preventing layer, surrounding the porous pillar and disposed within the dielectric layer;

a conductive via, extending within the dielectric layer and disposed adjacent to the porous pillar; and a conductive pad, disposed over the dielectric layer and covering the conductive via and the porous pillar.

13. The semiconductor structure of claim 12, further comprising:

a second moisture-preventing layer, disposed between the porous pillar and the conductive pad.

14. The semiconductor structure of claim 13, wherein the conductive via penetrates the second moisture-preventing layer and contacts the conductive pad.

15. The semiconductor structure of claim 13, further comprising:

a passivation layer, disposed over the dielectric layer and separated from the dielectric layer by the second moisture-preventing layer.

16. The semiconductor structure of claim 12, wherein the porous pillar includes one or more low-k materials.

17. The semiconductor structure of claim 12, wherein the conductive via includes tungsten, copper, cobalt, ruthenium, molybdenum, or a combination thereof.

18. The semiconductor structure of claim 12, wherein the conductive via includes a barrier member and a conductive member surrounded the conductive via, and the barrier member includes titanium, tantalum, titanium nitride, tantalum nitride, or a combination thereof.

19. The semiconductor structure of claim 12, wherein the first moisture-preventing layer includes nitride, high-k material, or a combination thereof.

\* \* \* \* \*